United States Patent
Lai et al.

(10) Patent No.: US 12,100,730 B2
(45) Date of Patent: Sep. 24, 2024

(54) METAL-INSULATOR-METAL CAPACITORS WITH THICK INTERMEDIATE ELECTRODE LAYERS AND METHODS OF FORMING THE SAME

(71) Applicant: Taiwan Semiconductor Manufacturing Company Limited, Hsinchu (TW)

(72) Inventors: Po-Chia Lai, Hsinchu (TW); Stefan Rusu, Sunnyvale, CA (US); Chun-Yen Lee, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/501,396

(22) Filed: Nov. 3, 2023

(65) Prior Publication Data

US 2024/0063253 A1    Feb. 22, 2024

Related U.S. Application Data

(63) Continuation of application No. 17/467,686, filed on Sep. 7, 2021, now Pat. No. 11,848,352.

(Continued)

(51) Int. Cl.
*H01L 23/522* (2006.01)
*H01L 21/768* (2006.01)
(Continued)

(52) U.S. Cl.
CPC ........ *H01L 28/60* (2013.01); *H01L 21/76838* (2013.01); *H01L 23/5223* (2013.01); *H01L 23/5226* (2013.01); *H01L 27/0805* (2013.01)

(58) Field of Classification Search
CPC .............. H01L 28/60; H01L 21/76838; H01L 23/5223; H01L 23/5226; H01L 27/0805;
(Continued)

(56) References Cited

U.S. PATENT DOCUMENTS 10,714,420 B1    7/2020 Rubin et al.
2007/0141778 A1*    6/2007 Lin ..................... H01L 28/56
257/E21.01

(Continued)

FOREIGN PATENT DOCUMENTS

TW    201115717 A    5/2011

OTHER PUBLICATIONS

Taiwan Patent and Trademark Office, Application No. 111100861, Office Action dated May 10, 2022, 10 pages.

(Continued)

*Primary Examiner* — John P. Dulka
(74) *Attorney, Agent, or Firm* — The Marbury Law Group, PLLC

(57) ABSTRACT

Integrated circuit (IC) devices include a metal-insulator-metal (MIM) capacitor having a top electrode plate, a bottom electrode plate, and a plurality of intermediate electrode plates between the top electrode plate and the bottom electrode plate. A plurality of dielectric layers may separate each of the electrode plates of the MIM capacitor from adjacent plates of the MIM capacitor. Each of the intermediate electrode plates may have a thickness that is greater than a thickness of the top electrode plate and the bottom electrode plate. By providing multiple intermediate electrode plates between the top and bottom electrode plates of the MIM capacitor, and allocating the greatest plate thicknesses to the intermediate plates, the capacitance density may be increased in a given area of the IC device, which may provide increased performance for the IC device.

20 Claims, 38 Drawing Sheets

Related U.S. Application Data

(60) Provisional application No. 63/151,889, filed on Feb. 22, 2021.

(51) Int. Cl.
*H01L 27/08* (2006.01)
*H01L 49/02* (2006.01)

(58) Field of Classification Search
CPC .. H01L 21/76805; H01L 27/016; H01L 28/40
See application file for complete search history.

(56) References Cited

U.S. PATENT DOCUMENTS

| | | |
|---|---|---|
| 2014/0159200 A1 | 6/2014 | Loke et al. |
| 2015/0294936 A1 | 10/2015 | Shen et al. |
| 2015/0295020 A1 | 10/2015 | Tseng et al. |
| 2018/0277620 A1 | 9/2018 | Leobandung |
| 2019/0305076 A1 | 10/2019 | Ando et al. |
| 2020/0035779 A1 | 1/2020 | Huang et al. |
| 2021/0036096 A1 | 2/2021 | Li et al. |
| 2021/0036100 A1 | 2/2021 | Lu et al. |
| 2021/0376151 A1* | 12/2021 | Van Dal ............ H01L 29/78696 |
| 2023/0030826 A1* | 2/2023 | Lee ..................... H01L 28/60 |

OTHER PUBLICATIONS

Taiwan Patent and Trademark Office, Application No. 111100861, Office Action dated Jul. 20, 2023, 6 pages.

* cited by examiner

METAL-INSULATOR-METAL CAPACITORS WITH THICK INTERMEDIATE ELECTRODE LAYERS AND METHODS OF FORMING THE SAME

RELATED APPLICATIONS

This application is a continuation of U.S. patent application Ser. No. 17/467,686 entitled "Metal-Insulator-Metal Capacitors and Methods for Forming the Same", filed on Sep. 7, 2021, which claims priority to U.S. Provisional Patent Application No. 63/151,889 entitled "Metal-Insulator-Metal Capacitor" filed on Feb. 22, 2021, the entire contents of both of which are hereby incorporated by reference for all purposes.

BACKGROUND

In general, a capacitor includes two conductive electrodes on opposing sides of a dielectric or other dielectric layer, and may be categorized based on the materials employed to form the capacitor. For example, in a metal-insulator-metal (MIM) capacitor, as its name suggests, the electrodes substantially comprise metallic materials and an insulator may comprise the dielectric layer. MIM capacitors are advantageous in that they possess a relatively constant value of capacitance over a relatively wide range of voltages applied thereto. MIM capacitors also exhibit a relatively small parasitic resistance.

In integrated circuit designs, on-chip capacitors are used in various applications including dynamic random access memories (DRAM), voltage controlled oscillators (VCO), phase-lock loops, operational amplifiers and other circuit designs. On-chip capacitors may also be used as decoupling capacitors that are configured to mitigate switching noise which may be caused by the switching of logic devices on the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
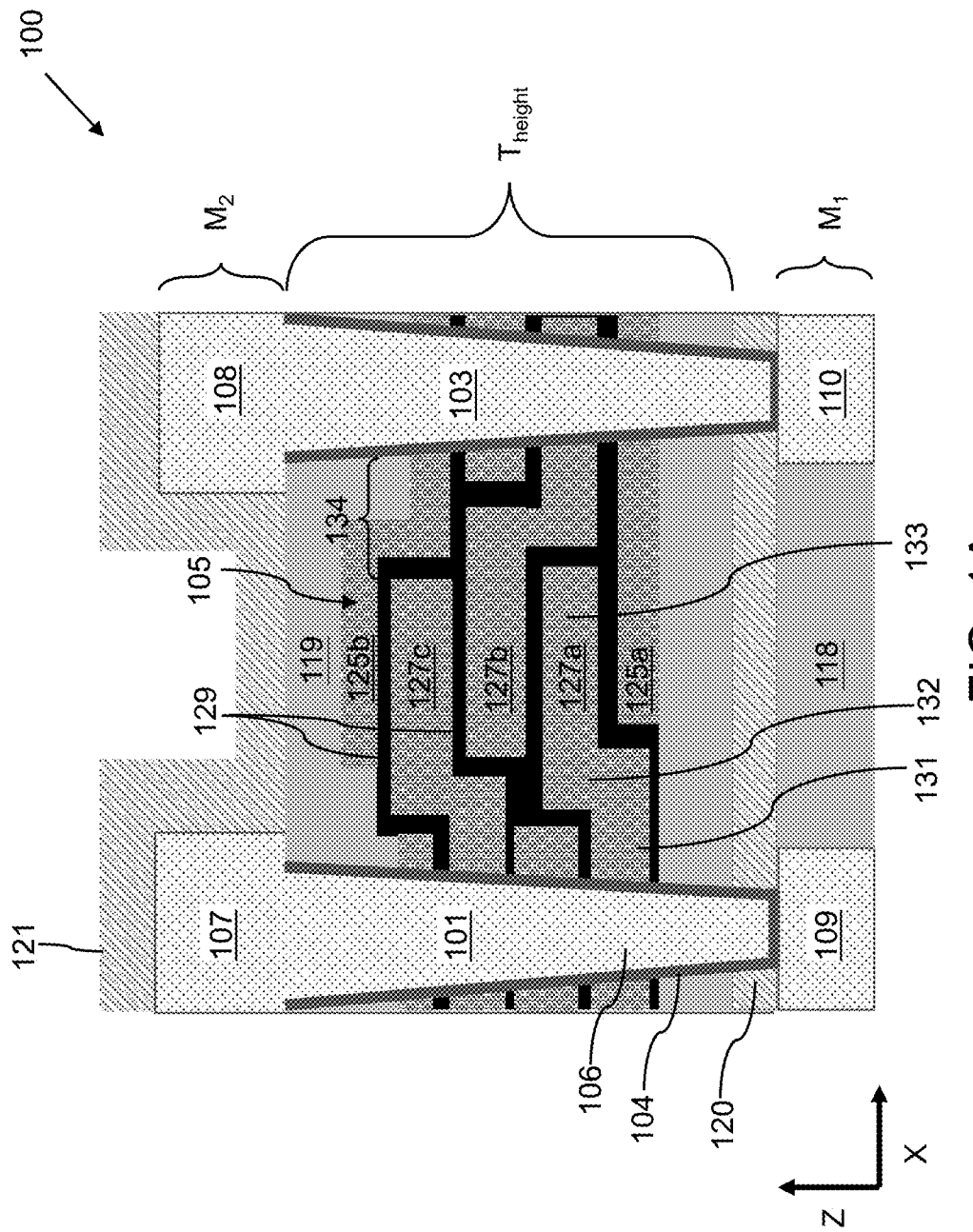
FIG. 1A is a vertical cross-section view of an exemplary structure of a portion of an integrated circuit (IC) device that includes a metal-insulator-metal (MIM) capacitor located between two conductive vias.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to semiconductor devices with metal-insulator-metal (MIM) capacitors. MIM capacitors are a type of capacitor that includes a top metal plate and a bottom metal plate separated by a thin layer of dielectric material. MIM capacitors are advantageous in that they possess a relatively constant value of capacitance over a relatively wide range of voltages applied thereto. MIM capacitors also exhibit a relatively small parasitic resistance. In integrated circuit designs, on-chip capacitors, such as MIM capacitors, may be used in various applications including dynamic random access memories (DRAM), voltage controlled oscillators (VCO), phase-lock loops, operational amplifiers and other circuit designs. On-chip capacitors may also be used as decoupling capacitors that may decrease noise on a power supply line, which may be caused by switching of logic devices within an integrated chip. For example, on-chip capacitors may be used to reduce switching noise due to a voltage drop on a power supply line caused by simultaneous switching of input/output (I/O) and core circuits within an integrated circuit (i.e., chip). Without decoupling capacitors this switching noise may increase signal delay, thereby reducing the operating frequency of an integrated circuit, and may also cause inadvertent state transitions in logic circuits within the integrated circuit.

Increases in the capacitance of a capacitor are desired as such increased capacitance may improve performance. Capacitance may be expressed in farads as $$C = \frac{\varepsilon A}{d},$$

where $\varepsilon$ is the permittivity of the dielectric material (absolute, not relative), A is the area of plate overlap in square meters, and d is the distance between plates in meters. Thus, as the area of the plate overlap increases, the capacitance may also increase in a direct relationship. Therefore, one solution to increase capacitance is to increase the area of the metal plates. However, in the context of semiconductor device fabrication, increasing the area of the plates reduces areal density of the devices that may ultimately be fabricated on a substrate since an increased footprint for the MIM will use up available real estate for other devices.

Various embodiments of the present disclosure are directed to integrated circuit (IC) devices including a metal-insulator-metal (MIM) capacitor having a top electrode plate, a bottom electrode plate, and a plurality of intermediate electrode plates between the top electrode plate and the bottom electrode plate. A plurality of dielectric layers may separate each of the electrode plates of the MIM capacitor from adjacent plates of the MIM capacitor. Each of the intermediate electrode plates may have a thickness that is greater than a thickness of the top electrode plate and the bottom electrode plate. By providing multiple intermediate electrode plates between the top and bottom electrode plates of the MIM capacitor, and allocating the greatest plate thicknesses to the intermediate plates, the capacitance density may be increased in a given area of the IC device, which may provide increased performance for the IC device, while not increasing the overall footprint of the MIM capacitor. Thus, additional room for other devices may be provided.

FIG. 1A is a vertical cross-sectional view of an exemplary structure of a portion of an integrated circuit (IC) device 100 that includes a metal-insulator-metal (MIM) capacitor 105 located between two conductive vias 101 and 103. Referring to FIG. 1A, in various embodiments, a MIM capacitor 105 may be located in an interconnect structure of the IC device 100. The interconnect structure may include a plurality of metal interconnect features, such as metal lines 107, 108, 109 and 110 and vias 101, 103, which may be partially or fully embedded in dielectric material(s) 118, 119, 120, 121. The metal interconnect features of the interconnect structure may be electrically connected to device structures of the IC device 100. The device structures may be semiconductor device structures, such as logic transistors, memory cells, diodes, photosensors, and the like. In some embodiments, the device structures may be formed on and/or in a semiconductor material substrate (not shown in FIG. 1A), using a front-end-of-line (FEOL) process. In various embodiments, the interconnect structure, including metal features 101, 103, 107, 108, 109, 110 and one or more MIM capacitors 105, may be formed over the semiconductor material substrate, and the device structures formed thereon, using a back-end-of-line (BEOL) process.

Referring again to FIG. 1A, the interconnect structure of the IC device 100 may include a plurality of metal levels, $M_1$, $M_2$, each containing metal features 107, 108, 109 and 110, and dielectric material layers 119 and 120 between the respective metal levels $M_1$, $M_2$. Dielectric material layers 118, 119, 120 and 121 may be composed of suitable dielectric materials, such as silicon oxide ($SiO_2$), silicon nitride (SiN, $Si_3N_4$), silicon carbide (SiC), undoped silicate glass (USG), a doped silicate glass, organosilicate glass, amorphous fluorinated carbon, porous variants thereof, or combinations thereof. Other dielectric materials are within the contemplated scope of disclosure. Dielectric material layer 120 may be composed of a different dielectric material than dielectric material layers 118 and 119. In various embodiments, dielectric material layer 120 may be an etch stop layer having different etch characteristics (e.g., a higher etch resistivity) than the material(s) of the adjacent dielectric material layers 118 and 119. In one non-limiting embodiment, dielectric material layer 119 may include silicon oxide, and dielectric material layer 120 may include silicon nitride. Dielectric material layer 119 may have a thickness, $T_{height}$, that is greater than the thickness of dielectric material layer 120.

A plurality of conductive vias 101, 103 may extend through dielectric material layers 119, 120 to electrically couple metal features 107, 108, 109 and 110 of different metal levels $M_1$, $M_2$. In various embodiments, the conductive vias 101, 103 may include a barrier layer 104 along the sidewalls and bottom surfaces of each of the conductive vias, and a metallic fill material 106 interior of the barrier layer 104. The barrier layer 104 may include a layer of TiN, TaN, WN, TiC, TaC, and WC, or combinations thereof. Other suitable materials for the barrier layer 104 are within the contemplated scope of disclosure. The metallic fill material 106 may include a suitable electrically conductive material, such as copper (Cu), tungsten (W), aluminum (Al), aluminum copper (AlCu), aluminum silicon copper (AlSiCu), cobalt (Co), ruthenium (Ru), molybdenum (Mo), tantalum (Ta), titanium (Ti), alloys thereof, combinations thereof, or the like. Other electrically conductive materials are within the contemplated scope of disclosure.

The metal features 107, 108, 109 and 110 may be composed of the same electrically conductive material(s) as the conductive vias 101, 103, or may be composed of different conductive material(s). In addition, the metal features 107, 108, 109, and 110 may optionally also include a barrier layer (not shown in FIG. 1A) over one or more outer surfaces of the metal features 107, 108, 109 and 110 and a metallic fill material interior of the barrier layer.

Although the exemplary portion of the interconnect structure shown in FIG. 1A includes two metal levels, $M_1$ and $M_2$, it will be understood that an interconnect structure according to various embodiments may include more than two metal levels.

In various embodiments, a MIM capacitor 105 may be located between two metal layers $M_1$ and $M_2$ of an interconnect structure of an IC device 100. In the exemplary embodiment shown in FIG. 1A, the MIM capacitor 105 may be located between an underlying metal level, $M_1$, and an overlying metal level, $M_2$. In some embodiments, the metal level $M_2$ that overlies the MIM capacitor 105 may be a redistribution layer. The redistribution layer may be a metal level on an IC device (i.e., a chip) that re-distributes the input-output pads of an integrated circuit such that an electrical connection may be made in another location of the IC device 100. In this manner, the redistribution layer may provide more convenient access to the input-output pads. Another example of the use for a redistribution layer may be to spread (i.e., distribute) the contact points around the IC device 100 so that solder balls may be applied, and the thermal stress of mounting may be spread (i.e., distributed) throughout the die. In various embodiments, a metal level $M_2$ forming a redistribution layer may include a plurality of metal features 107, 108 and a dielectric material layer 121 located over the upper surfaces and side surfaces of the metal features 107, 108 and over the upper surface of dielectric material layer 119. In various embodiments, dielectric material layer 121 may be composed of a different dielectric material than dielectric material layer 119. In one non-limiting embodiment, dielectric material layer 119 may include silicon oxide and dielectric material layer 121 may include silicon nitride. Although the exemplary embodiment of FIG. 1A shows the MIM capacitor between a redistribution layer ($M_2$) and an underlying metal layer ($M_1$), it will be understood that an MIM capacitor 105 according to various embodiments may be located between any metal levels of an interconnect structure of an IC device 100.

The MIM capacitor 105 may include a plurality of vertically stacked metal layers, which may also be referred to as electrode plates. Referring to FIG. 1A, the MIM capacitor 105 may include a pair of outer electrode plates 125a, 125b that are most proximate to metal levels $M_1$ and $M_2$, respectively. The uppermost outer electrode plate 125b may also be referred to as the top electrode plate, and the bottommost outer electrode plate 125a may also be referred to as the bottom electrode plate. The MIM capacitor 105 also includes a plurality of intermediate electrode plates 127a, 127b and 127c, which may be located between the top electrode plate 125b and the bottom electrode plate 125a. Although the exemplary embodiment of FIG. 1A shows three intermediate electrode plates 127a, 127b and 127c located between the top electrode plate 125b and the bottom electrode plate 125b, it will be understood that a MIM capacitor 105 according to various embodiments may include more or less than three intermediate electrode plates between the top electrode plate 125b and the bottom electrode plate 125a. In some embodiments, a MIM capacitor 105 according to various embodiments may include at least two intermediate electrode plates 127 between the top electrode plate 125b and the bottom electrode plate 125a.

Each of the electrode plates 125 (125a, 125b) and 127 (127a, 127b, 127c) of the MIM capacitor 105 may be separated from the adjacent electrode plates 125, 127 of the MIM capacitor 105 by a dielectric material layer 129. The dielectric material layers 129 between the electrode plates 125, 127 may be composed of a different dielectric material than dielectric material layer 119. In some embodiments, the dielectric material layers 129 may be composed of a high-k dielectric material. Examples of high-k dielectric materials include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), titanium oxide ($TiO_2$), alumina ($Al_2O_3$), hafnium dioxide-alumina ($HfO_2$—$Al_2O_3$), tantalum oxide ($Ta_2O_5$), $SiO_x/SiN_y/SiO_x$ or ferroelectrics. Other suitable dielectric materials are within the contemplated scope of disclosure.

As noted above, the MIM capacitor 105 may be located between two conductive vias 101, 103. In various embodiments, each of the electrode plates 125 and 127 of the MIM capacitor 105 may be conductively coupled to one of the adjacent conductive vias 101 and 103. In the exemplary embodiment shown in FIG. 1A, a first set of electrode plates, including intermediate electrode plate 127a and intermediate electrode plate 127c, are conductively coupled to conductive via 101, and a second set of electrode plates, including outer electrode plate 125a, intermediate electrode plate 127b, and outer electrode plate 125b, are conductively coupled to conductive via 103. In various embodiments, adjacent electrode plates of the MIM capacitor 105 may be alternately coupled to a first via 101 and a second via 103, respectively.

In the embodiment shown in FIG. 1A, the MIM capacitor 105 includes an odd number of intermediate electrode plates 127, such that both of the outer electrode plates 125a and 125b are coupled to the same conductive via 103, and the number of intermediate electrode plates 127a, 127c coupled to the other conductive via 101 is greater than the number of intermediate electrode plates 125b that are coupled to the same conductive via 103 as the outer electrode plates 125a, 125b. In alternative embodiments, the total number of intermediate electrode plates may be even. In such embodiments, the outer electrode plates 125a and 125b may each be coupled to different conductive vias 101, 103, and the number of intermediate electrode plates 127 coupled to each of the conductive vias 101 and 103 may be equal.

The electrode plates 125 and 127 may be composed of a suitable electrically conductive material, which may be the same material, or may be a different material, as the material of the conductive vias 101 and 103. Suitable electrically conductive materials for the electrode plates 125 and 127 may include, without limitation, copper (Cu), tungsten (W), aluminum (Al), aluminum copper (AlCu), aluminum silicon copper (AlSiCu), cobalt (Co), ruthenium (Ru), molybdenum (Mo), tantalum (Ta), titanium (Ti), alloys thereof, combinations thereof, or the like. Other electrically conductive materials are within the contemplated scope of disclosure. In addition, at least some of the electrode plates 125 and/or 127 may further include a barrier layer, which may be composed of a suitable metal nitride and/or metal carbide material, over one or more outer surfaces of the electrode plate 125, 127.

In various embodiments, during operation of the IC device 100, different voltages may be applied to the conductive vias 101 and 103 on opposing sides of the MIM capacitor 105. In one non-limiting example, one of the conductive vias 101/103 may be electrically coupled to ground, and the other conductive via 101/103 may be electrically coupled to a different, non-zero voltage, which may be a supply voltage. In some embodiments, one of the conductive vias 101/103 may be connected to a positive supply voltage (e.g., $V_{DD}$) and the other conductive via 101/103 may be connected to the ground voltage (e.g., $V_{SS}$). One of the conductive vias 101/103 may be used to couple the positive supply voltage (e.g., $V_{DD}$) to source terminal(s) of one or more field effect transistors (FETs) of the IC device 100, and the other conductive via 101/103 may be used to couple drain terminal(s) of the one or more field effect transistors to the ground voltage (e.g., $V_{SS}$) of the IC device 100.

Figure 1B:
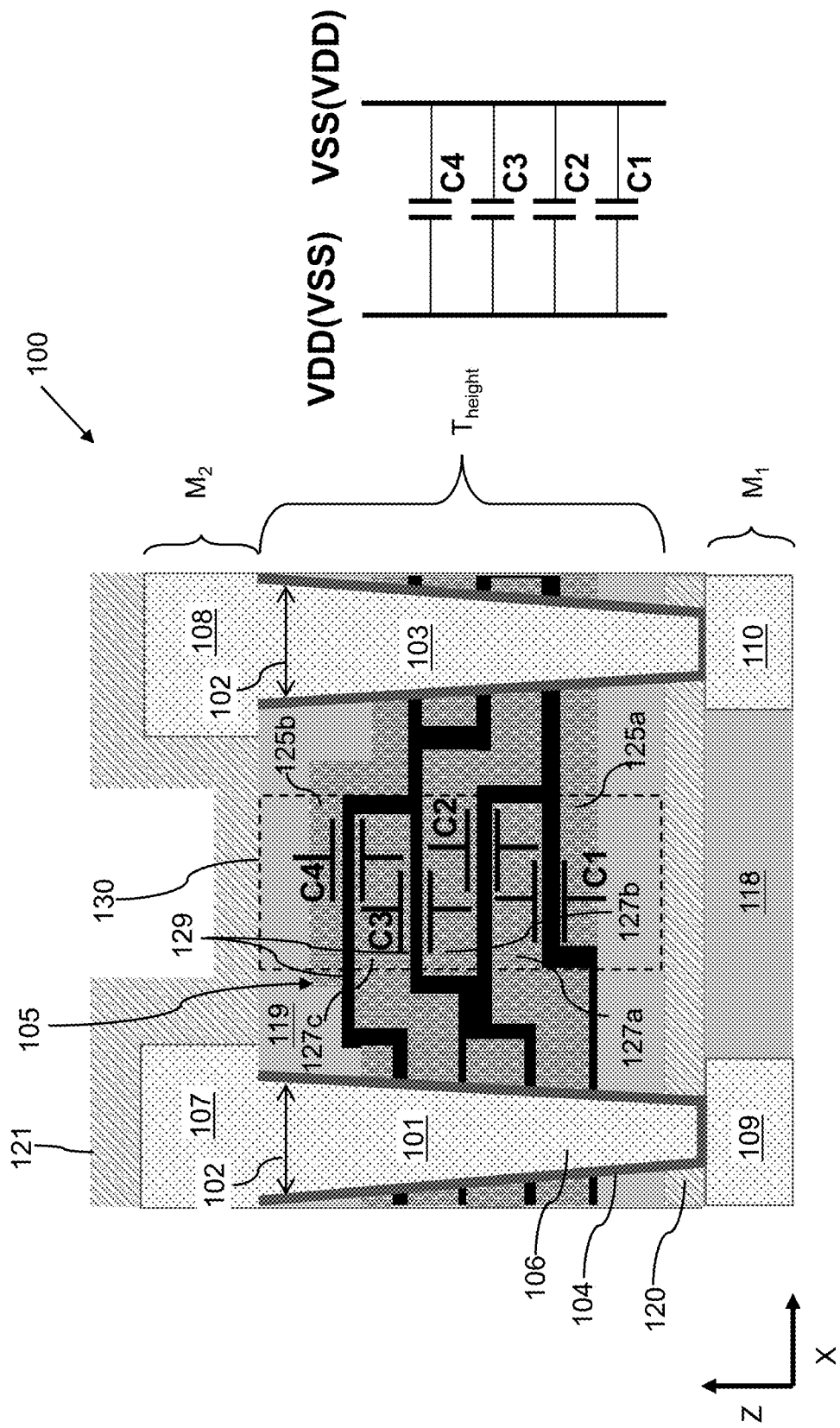
FIG. 1B is a vertical cross-sectional view of the exemplary structure of FIG. 1A that schematically illustrates the total capacitance of the MIM capacitor.

FIG. 1B is a vertical cross-sectional view of the exemplary structure that schematically illustrates the total capacitance ($C_{MIM}$) of the MIM capacitor 105. The MIM capacitor 105 may include a central region 130 in which all of the electrode plates 125, 127 overlap in the vertical (z-axis) direction. The MIM capacitor 105 may have a first capacitance, C1, between outer electrode plate 125a and intermediate electrode plate 127a, a second capacitance, C2, between intermediate electrode plate 127a and intermediate electrode plate 127b, a third capacitance, C3, between intermediate electrode plate 127b and intermediate electrode plate 127c, and a fourth capacitance, C4, between intermediate electrode plate 127c and outer electrode plate 125b. The total capacitance, $C_{MIM}$, between the first via 101 and the second via 103 may be the sum of these capacitances, or $C_{MIM}$=C1+C2+C3+C4.

There are several constraints on the maximum capacitance, $C_{MIM}$, that may be achieved between the first via 101 and the second via 103 using a MIM capacitor 105 such as shown in FIGS. 1A and 1B. As noted above, the overall capacitance of the MIM capacitor 105 may be increased by increasing the area of electrode plate overlap. However, increasing the electrode plate overlap area may also require increasing the lateral spacing between the conductive vias 101, 103 (i.e., along the x-axis direction in FIG. 1B). This may have a number of undesirable effects on the IC device 100 design and performance, such as decreasing the density of the IC device 100 and/or requiring a larger chip area. In addition, increasing the via spacing may result in the circuits experiencing a larger voltage drop and/or a lower operating frequency. Another technique that may be used to increase total capacitance is to increase the total number of electrode plates in the vertical stack. However, adding additional electrode plates requires additional processing steps which may increase fabrication time and costs. In addition, because the available space along the vertical (z-axis) direction is limited by the thickness, $T_{height}$, of dielectric layer 119, there is a limit to the number of electrode plates that may be stacked between the conductive vias 101 and 103.

Figure 1C:
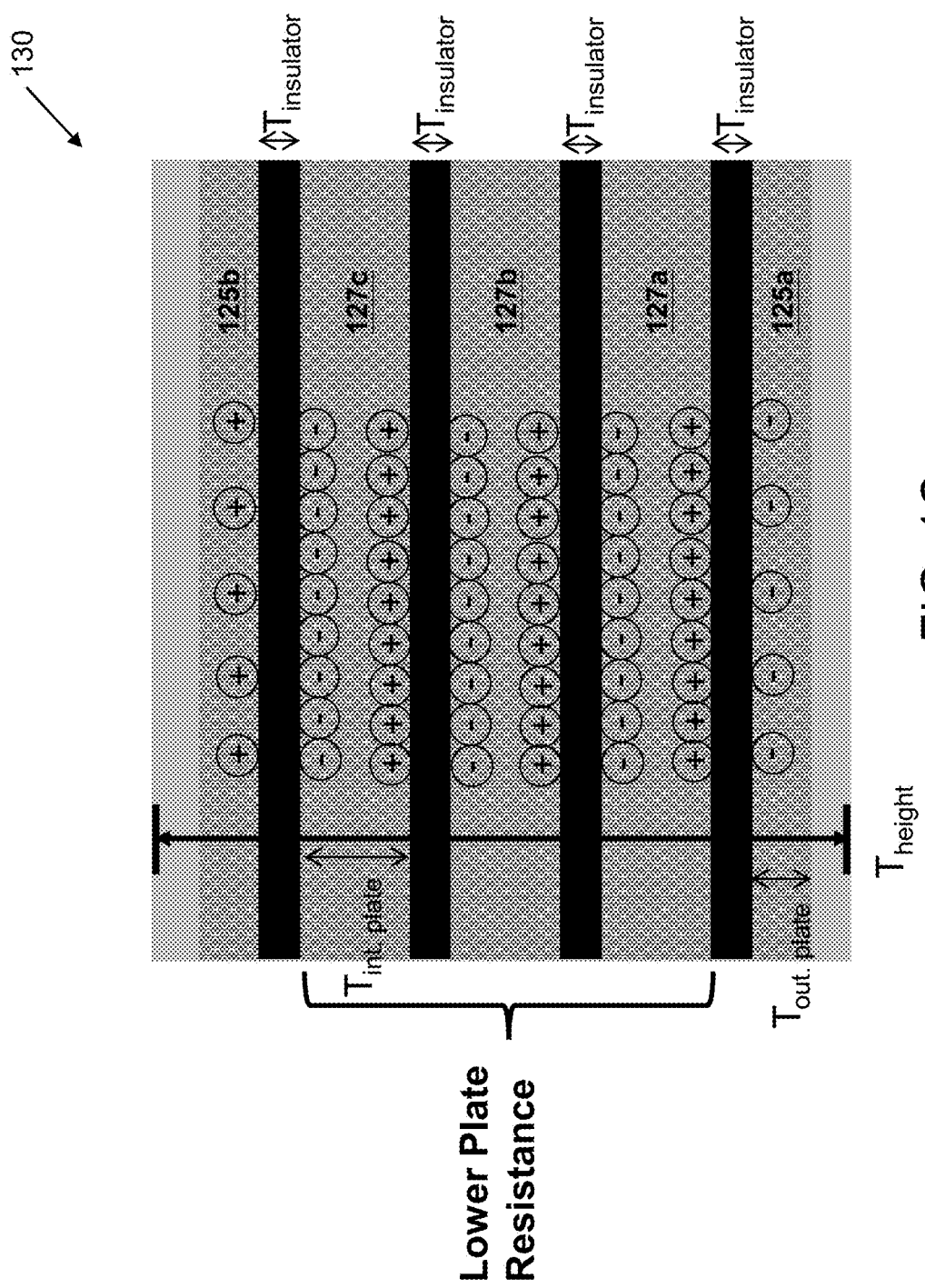
FIG. 1C is an enlarged vertical cross-sectional view of a central region of the MIM capacitor shown in FIGS. 1A and 1B.

According to various embodiments of the present disclosure, a MIM capacitor 105 having increased capacitance may include intermediate electrode plates 127 having a greater thickness than the thicknesses of the outer electrode plates 125. By allocating a greater share of the total plate thickness of the MIM capacitor 105 to the intermediate electrode plates 127, the overall capacitance, $C_{MIM}$, of the MIM capacitor 105 may be increased without increasing the overall size of the MIM capacitor 105. Increasing the thickness of the intermediate electrode plates 127 provides a lower resistance in the intermediate electrode plates and an increase in the overall capacitance, $C_{MIM}$, of the MIM capacitor 105. This is schematically illustrated in FIG. 1C, which is an enlarged cross-section view of the central region 130 of the MIM capacitor 105 shown in FIGS. 1A and 1B. As schematically illustrated in FIG. 1C, as the resistance of the intermediate electrode plates 127 is decreased, the current flow, and thereby the charge accumulation of each plate, is increased. The increase in charge accumulation on the intermediate electrode plates 127 occurs on two sides of the intermediate electrode plates 127, each of which is adjacent to another electrode plate of the MIM capacitor 105. This increased charge accumulation may increase the capacitances across both sides of the intermediate electrode plate 127. In contrast, each of the outer electrode plates 125 are adjacent to only one other plate. Thus, an increase in charge accumulation on an outer plate 125 may only increase the capacitance across a single side of the outer plate 125. Thus, by providing the greatest plate thicknesses to the intermediate electrode plates 127, the overall capacitance, $C_{MIM}$, of the MIM capacitor 105 may be increased.

In various embodiments, the thickness ($T_{int.\ plate}$) of each of the intermediate electrode plates 127a, 127b, 127c may be greater than the thicknesses ($T_{out.\ plate}$) of the outer electrode plates 125a, 125b of the MIM capacitor 105. In embodiments, the thickness ($T_{int.\ plate}$) of the intermediate electrode plates 127a, 127b, 127c may be at least 50 nm, such as between 50 nm and 100 nm, and the thickness ($T_{out.\ plate}$) of the outer electrode plates 125a, 125b may be less than 50 nm, such as between 10 nm and 45 nm. The thickness of the dielectric material layers 129, $T_{insulator}$, may be less than the thicknesses of the electrode plates 125a, 125b, 127a, 127b, 127c. In various embodiments, the widths 102 of the conductive vias 101 and 103 may be in a range between about 1 μm and about 10 μm, although thicker or thinner conductive vias may be used.

Referring again to FIG. 1A, each of the intermediate electrode plates 127a, 127b and 127c may include a first horizontally-extending segment 131 that contacts a conductive via 101, 103, a second horizontally-extending segment 133 that extends into the central region 130 (see FIG. 1B) of the MIM capacitor 105, and a vertically-extending segment 132 that extends between the first horizontally-extending segment 131 and the second horizontally-extending segment 133. The upper surface of the second horizontally-extending segment 133 may be above the upper surface of the first horizontally-extending segment 131. In embodiments, at least one of the outer electrode plates (e.g., the bottom electrode plate 125a as shown in FIG. 1A) may extend continuously in a horizontal direction between a conductive via 101, 103 and the central region 130 of the MIM capacitor 105. In some embodiments, at least one of the outer electrode plates (e.g., the top electrode plate 125b as shown in FIG. 1A) may include a first horizontally-extending segment that contacts a conductive via 101, 103, a second horizontally-extending segment that extends into the central region 130 of the MIM capacitor 105, and a vertically-extending segment that extends between the first and second horizontally-extending segments. A gap 134 may be present between a peripheral edge of each electrode plate 125a, 125b, 127a, 127b, 127c and the conductive via 101, 103 to which the respective electrode plate 125a, 125b, 127a, 127b, 127c is not conductively coupled.

Figure 2:
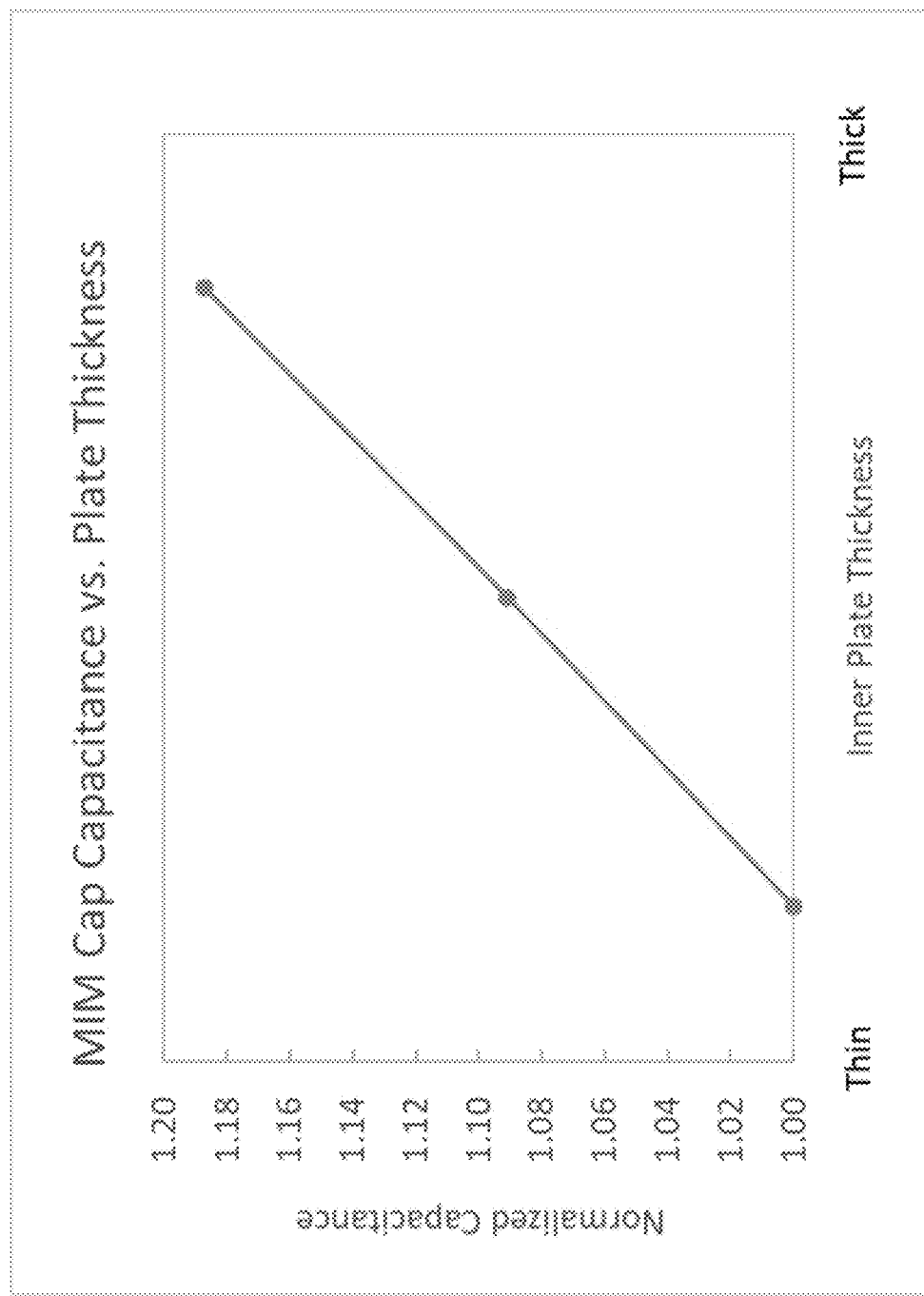
FIG. 2 is a plot showing the normalized capacitance of a MIM capacitor as a function of the thickness of the intermediate electrode plates at a package resonant frequency of 200 MHz.
Figure 3:
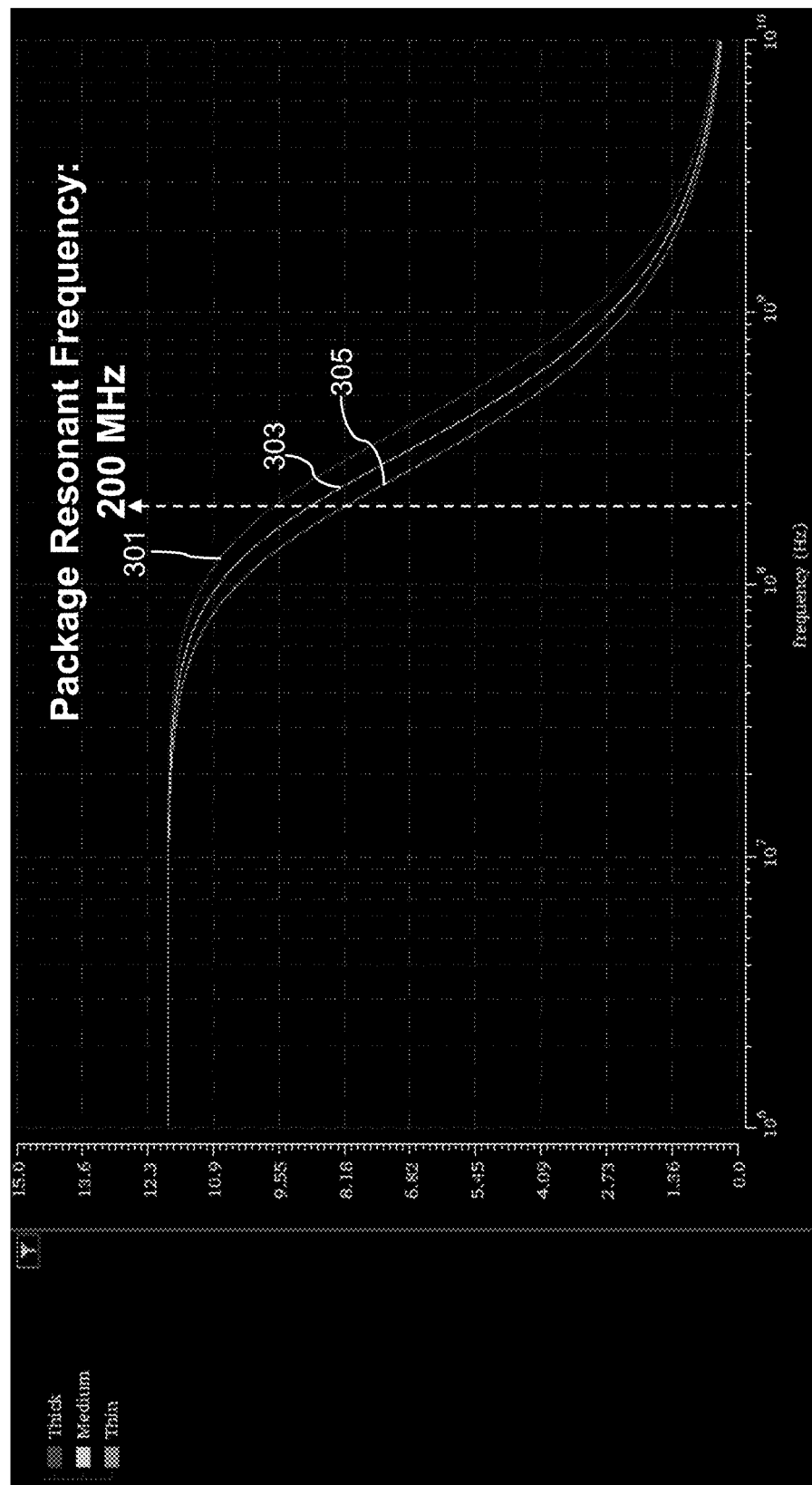
FIG. 3 is a plot showing the effective capacitance as a function of package resonant frequency for three MIM capacitors having different intermediate electrode plate thicknesses.

FIG. 2 is a plot showing the normalized capacitance of a MIM capacitor as a function of the thickness of the intermediate electrode plates at a package resonant frequency of 200 MHz. As shown in FIG. 2, increasing the thickness of the intermediate electrode plates may increase the capacitance by ~20%. FIG. 3 is a plot showing the effective capacitance as a function of package resonant frequency for three MIM capacitors having different intermediate electrode plate thicknesses. Referring to FIG. 3, at a package resonant frequency of 200 MHz, the highest effective capacitance is with the MIM capacitor having the thickest intermediate electrode plates (curve 301), followed by the MIM capacitor having medium-thickness intermediate electrode plates (curve 303), and the MIM capacitor having the thinnest intermediate electrode plates (curve 305).

Figure 4:
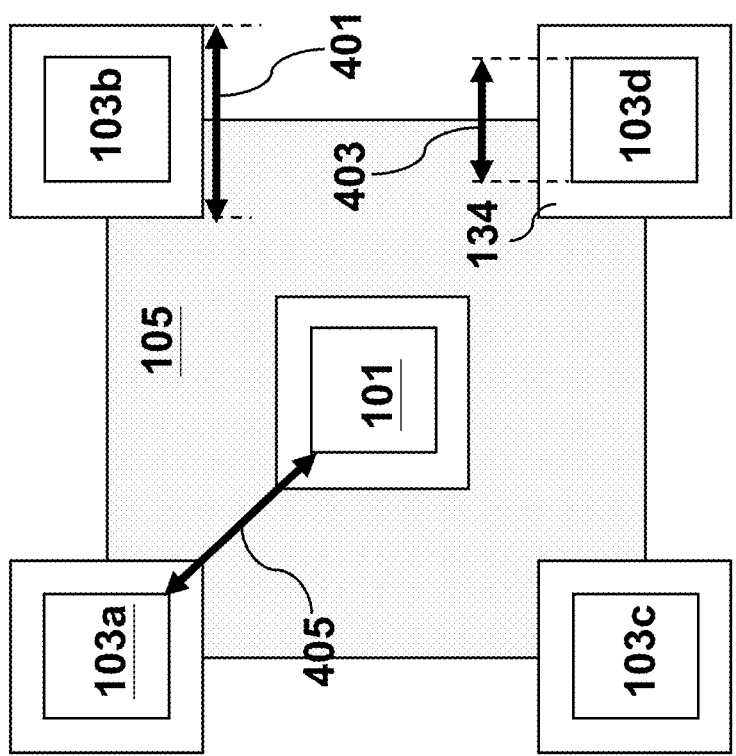
FIG. 4 is a horizontal cross-sectional view of an exemplary structure of a portion of an integrated circuit (IC) device that includes a MIM capacitor and a plurality of conductive vias.

FIG. 4 is a horizontal cross-sectional view of an exemplary structure of a portion of an integrated circuit (IC) device 100 that includes a MIM capacitor 105 and a plurality of conductive vias 101 and 103. Referring to FIG. 4, a MIM capacitor 105 such as shown in FIGS. 1A-1C is shown in a horizontal cross-sectional view (i.e., in the x-y plane). The MIM capacitor 105 extends between a plurality of conductive vias, including a central conductive via 101 and four peripheral conductive vias 103a, 103b, 103c and 103d surrounding the central conductive via 101. The central via 101 may be connected to a first voltage, and the peripheral conductive vias 103a, 103b, 103c and 103d may be connected to a second voltage that is different than the first voltage. The MIM capacitor 105 may be a unit capacitor including a first plurality of electrode plates conductively coupled to the central conductive via 101 and a second plurality of electrode plates conductively coupled to the peripheral conductive vias 103a, 103b, 103c and 103d. In some embodiments, the central conductive via 101 may be connected to a positive supply voltage (e.g., $V_{DD}$) and the peripheral conductive vias 103a, 103b, 103c and 103d may be connected to the ground voltage (e.g., $V_{SS}$). FIG. 4 also illustrates the width 401 of the via openings and the width 403 of the vias 101, 103 in the horizontal (x-y) plane. FIG. 4 additionally illustrates the gap 134 between the peripheral edge of the electrode plates and the conductive via(s) 101, 103a, 103b, 103c to which the respective electrode plates are not conductively coupled. In the embodiment shown in FIG. 4, the via-to-via spacing 405 between the central conductive via 101 connected to the first voltage and the peripheral conductive vias 103a, 103b, 103c, 103d connected to the second voltage is uniform.

Figure 5:
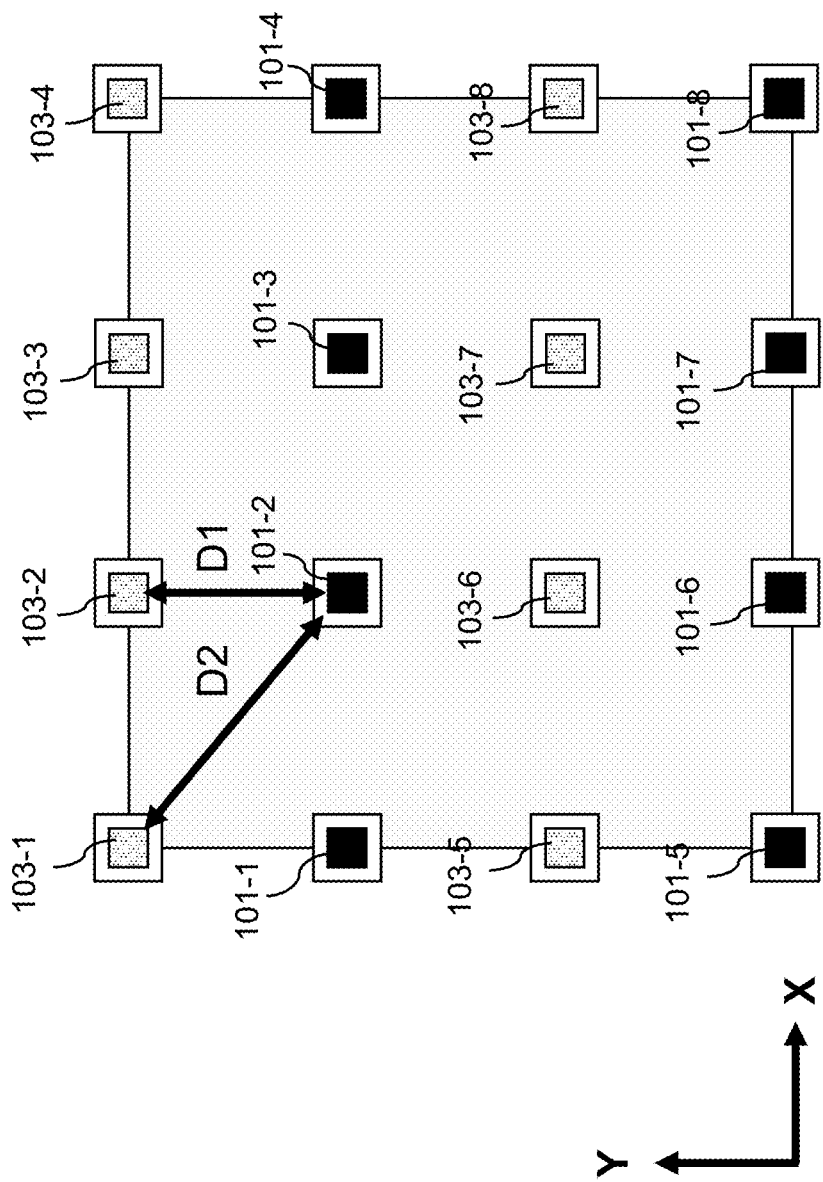
FIG. 5 is a horizontal cross-sectional view of an exemplary structure showing an arrangement of an array of conductive vias according to an embodiment of the present disclosure.

FIG. 5 is a horizontal cross-sectional view of an exemplary structure showing an arrangement of an array of conductive vias 101, 103 according to an embodiment of the present disclosure. Referring to FIG. 5, the vias 101, 103 may be arranged in a rectangular array pattern. Alternating rows of vias 101, 103 may be connected to different voltages. As shown in FIG. 5, for example, vias 101-1 through 101-8 may be connected to a first voltage, and vias 103-1 through 103-8 may be connected to a second voltage that is different than the first voltage. In some embodiments, vias 101-1 through 101-8 may be connected to a positive supply voltage (e.g., $V_{DD}$) and vias 103-1 through 103-8 may be connected to the ground voltage (e.g., $V_{SS}$). A plurality of MIM capacitors (not shown in FIG. 5) may be located between adjacent vias 101, 103 that are connected to different voltages. In the via array of FIG. 5, the via-to-via spacing between adjacent vias 101 and 103 connected to different voltages are not uniform. In particular, adjacent vias (e.g., vias 101-2 and 103-2) that are spaced along the direction of the y-axis have a first via-to-via spacing, D1, while adjacent vias (e.g., vias 101-2 and 103-1) that are spaced diagonally have a second via-to-via spacing, D2, that is greater than D1.

Figure 6:
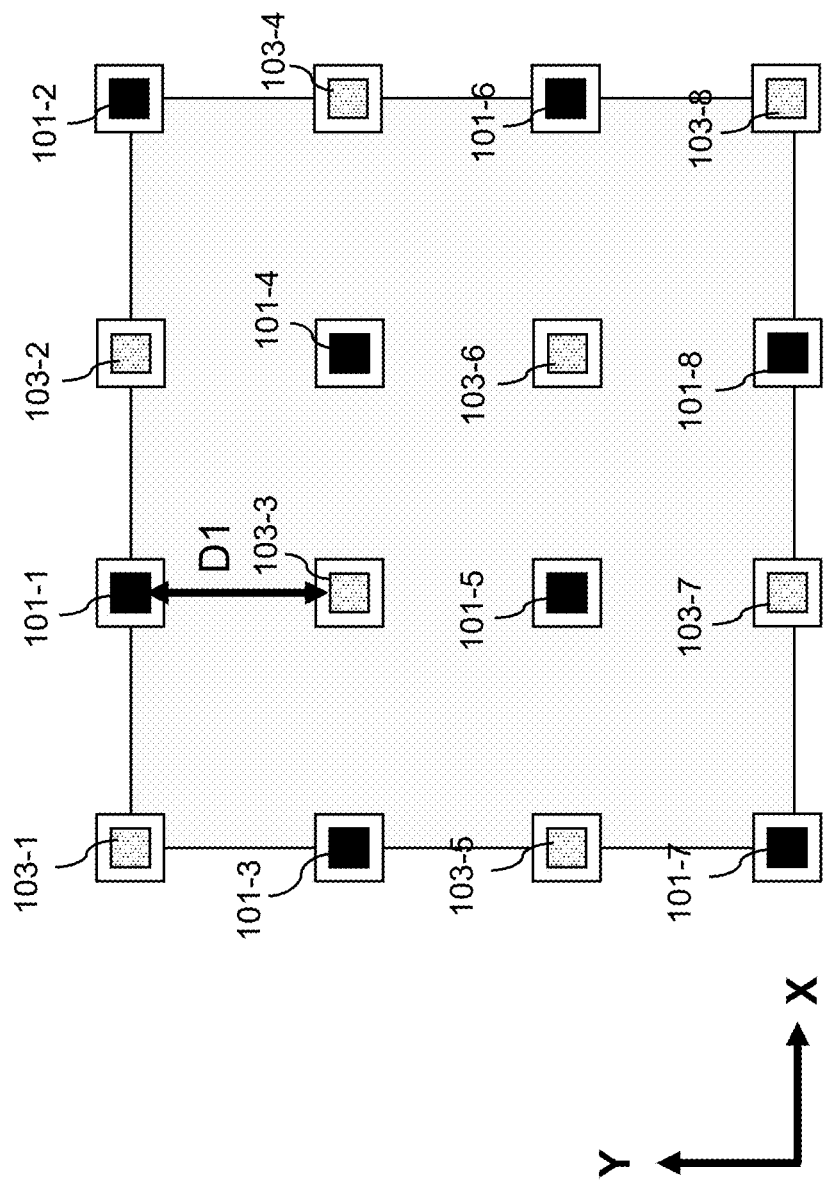
FIG. 6 is a horizontal cross-sectional view of an exemplary structure showing another arrangement of an array of conductive vias according to an embodiment of the present disclosure.

FIG. 6 is a horizontal cross-sectional view of an exemplary structure showing another arrangement of an array of conductive vias 101, 103 according to an embodiment of the present disclosure. Referring to FIG. 6, the vias 101, 103 may be arranged in a rectangular array pattern. The arrangement of FIG. 6 differs from that shown in FIG. 5 in that alternating vias 101, 103 in both the x-axis and y-axis directions may be connected to different voltages. In some embodiments, vias 101-1 through 101-8 may be connected to a positive supply voltage (e.g., $V_{DD}$) and vias 103-1 through 103-8 may be connected to the ground voltage (e.g., $V_{SS}$). A plurality of MIM capacitors (not shown in FIG. 6) may be located between adjacent vias 101, 103 that are connected to different voltages. By alternating the vias 101 and 103 in the x- and y-directions, the via-to-via spacing, D1, between adjacent vias connected to different voltages may be uniform.

Figure 7:
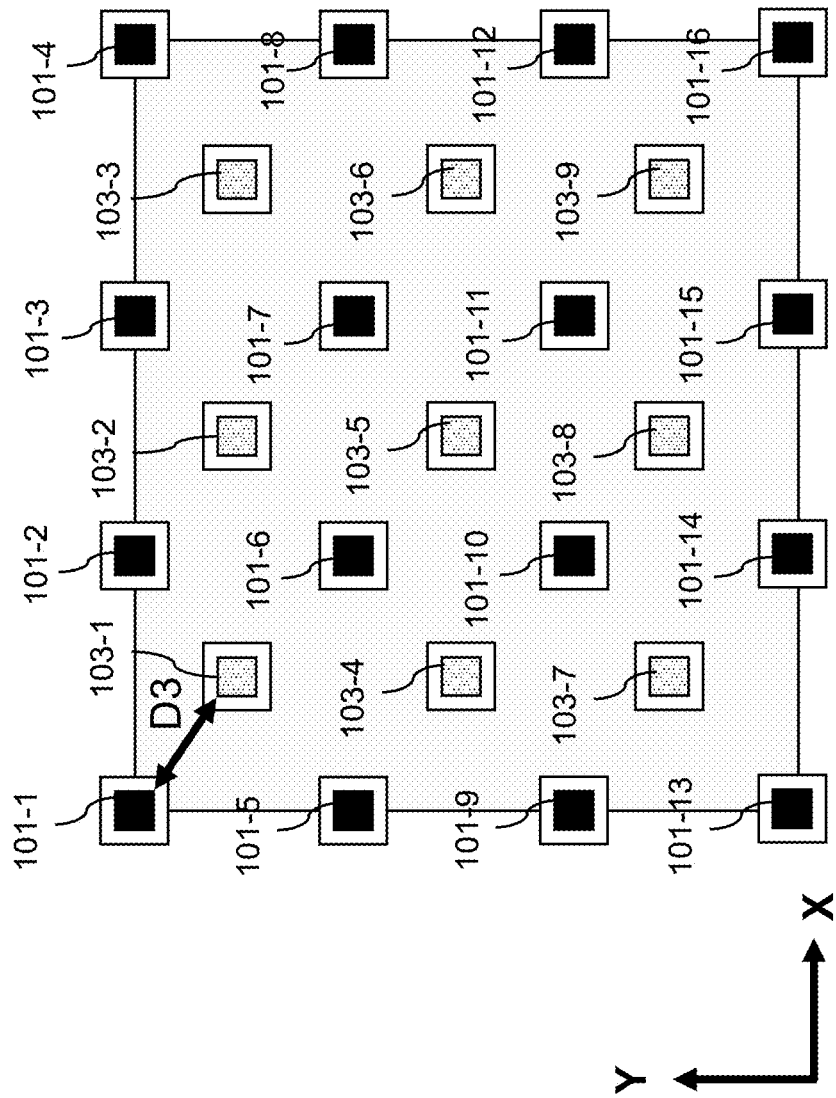
FIG. 7 is a horizontal cross-sectional view of an exemplary structure showing yet another arrangement of an array of conductive vias according to an embodiment of the present disclosure.

FIG. 7 is a horizontal cross-sectional view of an exemplary structure showing yet another arrangement of an array of conductive vias 101, 103 according to an embodiment of the present disclosure. Referring to FIG. 7, the vias 101, 103 may be arranged in a rectangular array pattern including alternating rows of vias 101, 103 that are connected to different voltages. The vias 101, 103 in each row may be offset from the vias 101, 103 in the adjacent row(s). In particular, the vias 101 connected to a first voltage may be offset in the x-axis direction such that they are located between the vias 103 connected to the second voltage. In some embodiments, vias 101-1 through 101-169 may be connected to a positive supply voltage (e.g., $V_{DD}$) and vias 103-1 through 101-16 may be connected to the ground voltage (e.g., $V_{SS}$). A plurality of MIM capacitors (not shown in FIG. 7) may be located between adjacent vias 101, 103 that are connected to different voltages. By providing alternating rows of vias 101, 103 connected to different voltages and off-setting the vias in each row from the vias in adjacent rows, the via-to-via spacing, D3, between adjacent vias connected to different voltages may be uniform. In addition, the via-to-via spacing, D3, in the arrangement of FIG. 7 may be less than the via-to-via spacing, D1 and D3, in the embodiments of FIGS. 5 and 6, and a greater number of vias 101, 103 may be provided in the same area of the IC device 100.

Figure 8:
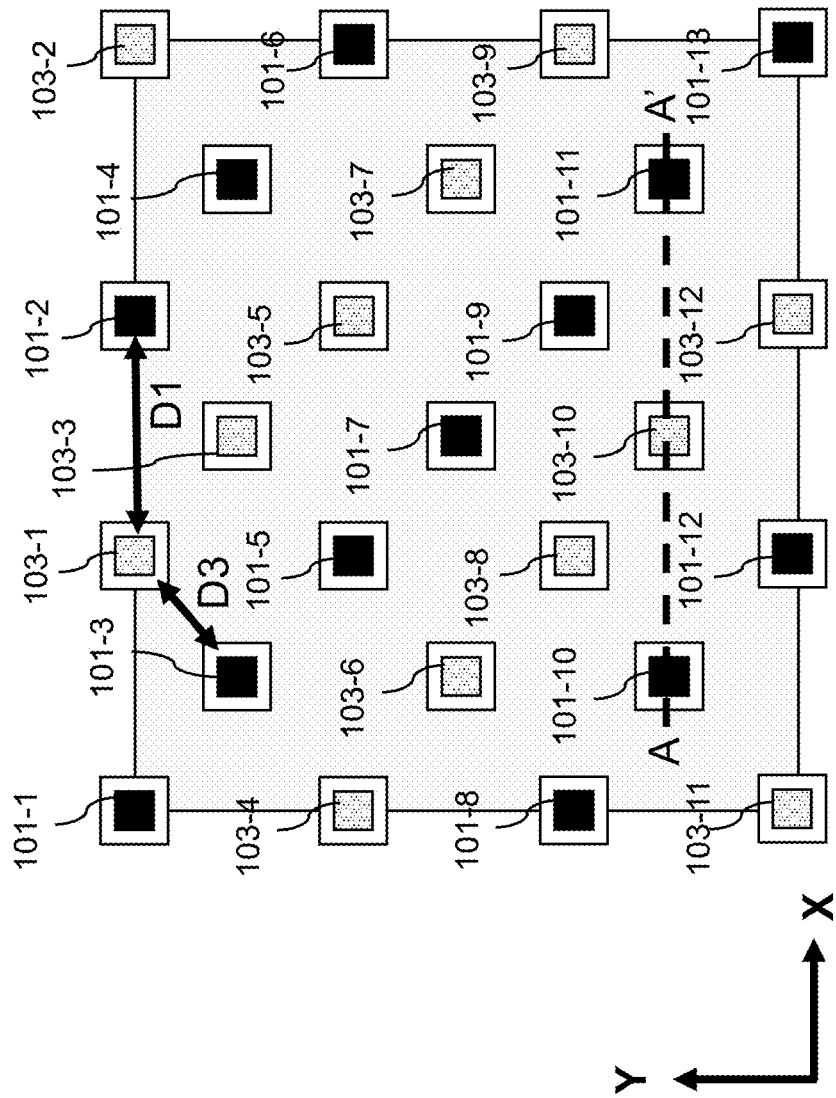
FIG. 8 is a horizontal cross-sectional view of an exemplary structure showing yet another arrangement of an array of conductive vias according to an embodiment of the present disclosure.

FIG. 8 is a horizontal cross-sectional view of an exemplary structure showing yet another arrangement of an array of conductive vias 101, 103 according to an embodiment of the present disclosure. Referring to FIG. 8, the vias 101, 103 may be arranged in a rectangular array pattern with the vias 101, 103 in each row offset from the vias 101, 103 in the adjacent row(s). In addition, the alternating vias 101, 103 within each row may be connected to different voltages. In some embodiments, vias 101-1 through 101-13 may be connected to a positive supply voltage (e.g., $V_{DD}$) and vias 103-1 through 103-12 may be connected to the ground voltage (e.g., $V_{SS}$). A plurality of MIM capacitors (not shown in FIG. 8) may be located between adjacent vias 101, 103 that are connected to different voltages. In this arrangement, there may be two different via-to-via spacings, D1 and D3, between vias connected to different voltages. In particular, adjacent vias (e.g., vias 103-1 and 101-2) that are spaced along the direction of the x-axis or the y-axis have a first via-to-via spacing, D1, while adjacent vias (e.g., vias 103-1 and 101-3) that are spaced diagonally have a second via-to-via spacing, D3, that is less than D1.

Figure 9A:
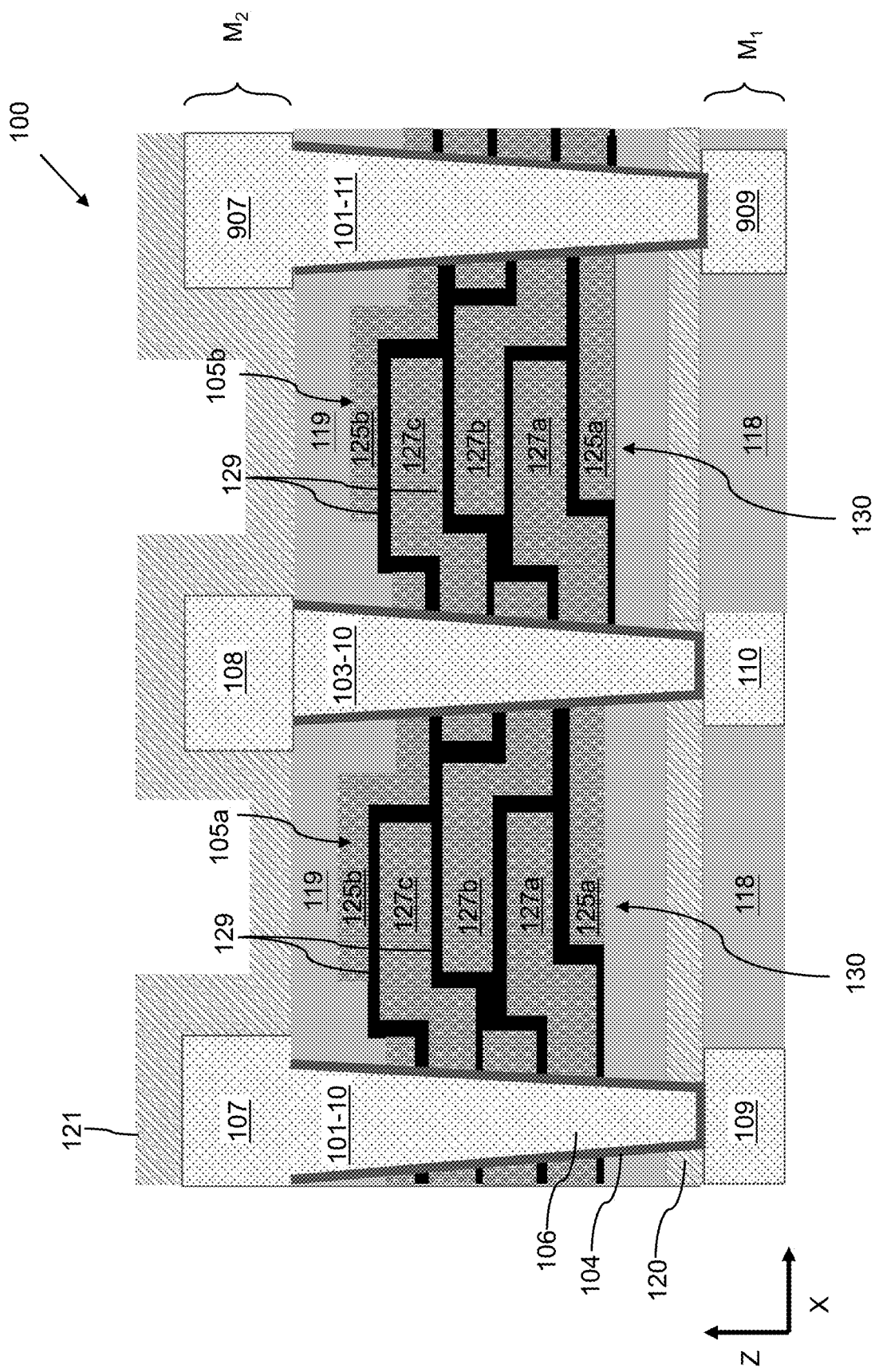
FIGS. 9A and 9B are vertical cross-sectional views of the exemplary structure of FIG. 8 along line A-A' showing different configurations of MIM capacitors between conductive vias according to various embodiments of the present disclosure.
Figure 9B:
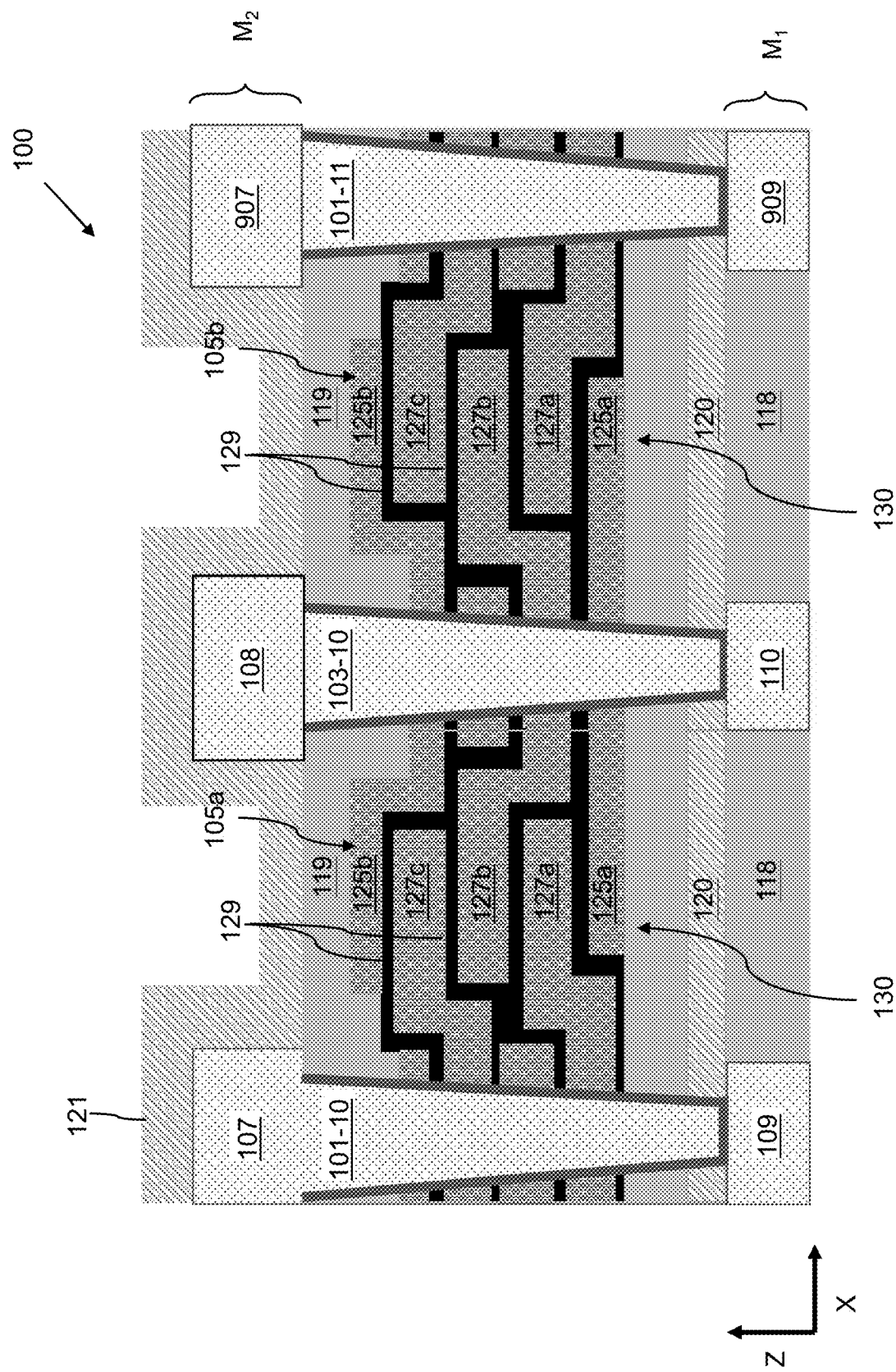

FIGS. 9A and 9B are vertical cross-sectional views of the exemplary structure of FIG. 8 along line A-A' showing different configurations of MIM capacitors 105 between conductive vias 101-10, 103-10 and 101-11. Referring to FIG. 9A, MIM capacitor 105*a* between conductive vias 101-10 and 103-10 may have an identical configuration as MIM capacitor 105*b* between conductive vias 103-10 and 101-11. In particular, in MIM capacitor 105*a*, intermediate electrode plates 127*a* and 127*c* may extend from conductive via 101-10 to the central region 130 of the MIM capacitor 105*a*, while outer electrode plates 125*a* and 125*b* and intermediate electrode plate 127*b* may extend from the adjacent conductive via 103-10 to the central region 130 of the MIM capacitor 105*a*. MIM capacitor 105*b* may have an analogous configuration, in which intermediate electrode plates 127*a* and 127*c* may extend from conductive via 103-10 to the central region 130 of the MIM capacitor 105*b*, while outer electrode plates 125*a* and 125*b* and intermediate electrode plate 127*b* may extend from the adjacent conductive via 101-11 to the central region 130 of the MIM capacitor 105*a*.

FIG. 9B illustrates an alternative embodiment in which the MIM capacitors 105*a* and 105*b* have a symmetric configuration. In particular, MIM capacitor 105*a* located between conductive vias 101-10 and 103-10 in FIG. 9B includes intermediate electrode plates 127*a* and 127*c* extending from conductive via 101-10 to the central region 130 of the MIM capacitor 105*a*, and outer electrode plates 125*a* and 125*b* and intermediate electrode plate 127*b* extending from the adjacent conductive via 103-10 to the central region 130 of the MIM capacitor 105*a*. MIM capacitor 105*b* located between conductive vias 103-10 and 101-11 may have a symmetric configuration with respect to MIM capacitor 105*a* in which outer electrode plates 125*a* and 125*b* and intermediate electrode plate 127*b* extend from conductive via 103-10 to the central region 130 of MIM capacitor 105*b*, and intermediate electrode plates 127*a* and 127*c* extend from conductive via 101-11 to the central region 130 of the MIM capacitor 105*b*. In general, in a configuration having identical (i.e., non-symmetric) MIM capacitors 105*a*, the electrode plate(s) that are in conductive contact with a conductive via 101, 103 on a first side of the conductive via 101, 103 may be different from the electrode plate(s) that are in conductive contact the conductive via 101, 103 on a second side of the conductive via 101, 103 that is opposite the first side, and in a symmetrical configuration, the same electrode plate(s) may conductively contact both the first and second sides of the conductive via 101, 103. In various embodiments, the MIM capacitors 105 in any of the via layouts shown in FIGS. 4-8 may have an identical configuration, a symmetric configuration, or a combination of identical and symmetric configurations.

As schematically illustrated in FIGS. 4-8, different via layouts may provide different via-to-via distances (e.g., D1, D2 and D3) between conductive vias 101 and 103 that are connected to different voltages. For the MIM capacitors 105 located between the vias 101 and 103, the via-to-via distance may affect the performance of the capacitor. A shorter via-to-via distance may decrease the effective capacitor area of the MIM capacitor 105. However, this may be partially offset by the reduction in overall resistance of the capacitor due to a shorter via-to-via distance. In various embodiments, there may be an optimal via-to-via distance to obtain the maximum capacitance while using the MIM capacitor structure in the overall chip design. In some embodiments, the via-to-via distance may be between about 2 μm and about 15 μm, such as between about 5 μm and about 10 μm.

Figure 10:
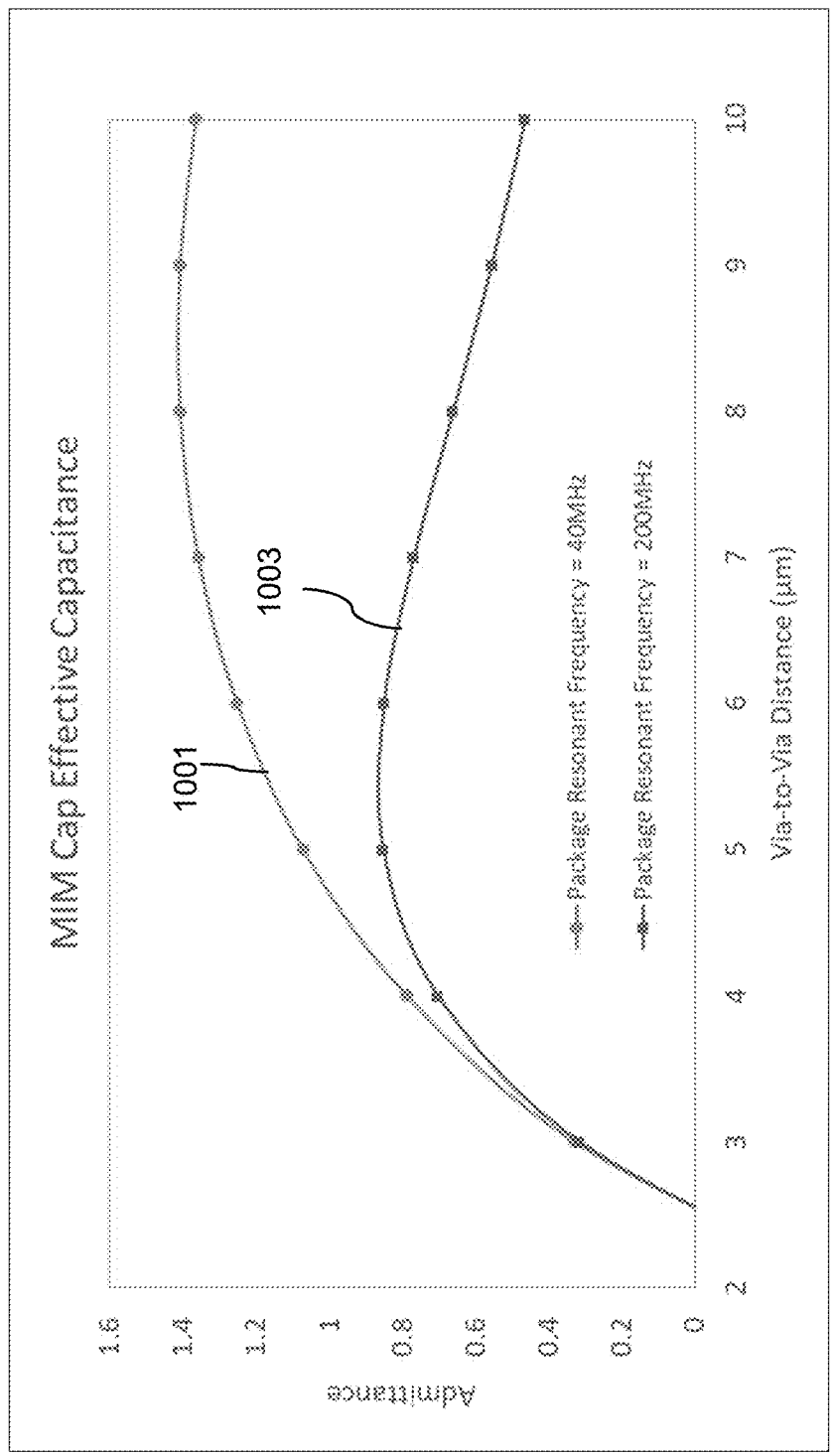
FIG. 10 is a plot showing the admittance of a MIM capacitor as a function of via-to-via distance for IC device packages having resonant frequencies of 40 MHz and 200 MHz.

The effect of the via-to-via distance on MIM capacitor performance may also be a function of the resonant frequency of the package in which the IC device 100 (i.e., die) is integrated. FIG. 10 is a plot showing the admittance of a MIM capacitor 105 as a function of via-to-via distance for IC device packages having resonant frequencies of 40 MHz (curve 1001) and 200 MHz (curve 1003). As illustrated in FIG. 10, the maximum effective capacitance of the MIM capacitor in the package having the higher resonant frequency (curve 1003) is at a lower via-to-via distance (e.g., ~5 μm) than the maximum effective capacitance of the MIM capacitor in the package having a lower resonant frequency (curve 1001), which is at a via-to-via distance of approximately 8 μm.

Figure 11A:
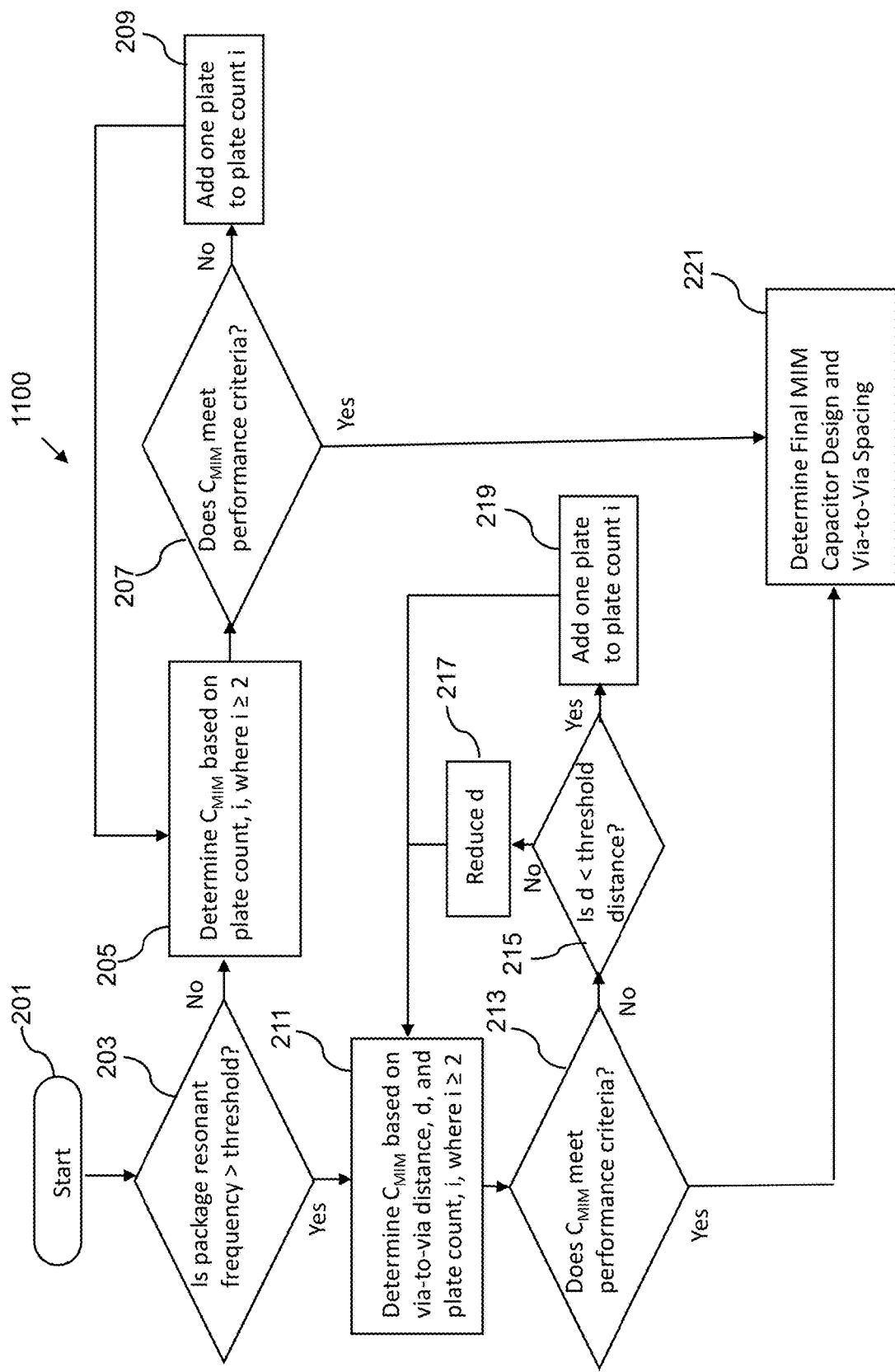
FIG. 11A is a flow diagram illustrating a method of designing a MIM capacitor coupled between a first via and a second via in an IC device according to an embodiment of the present disclosure.
Figure 11B:
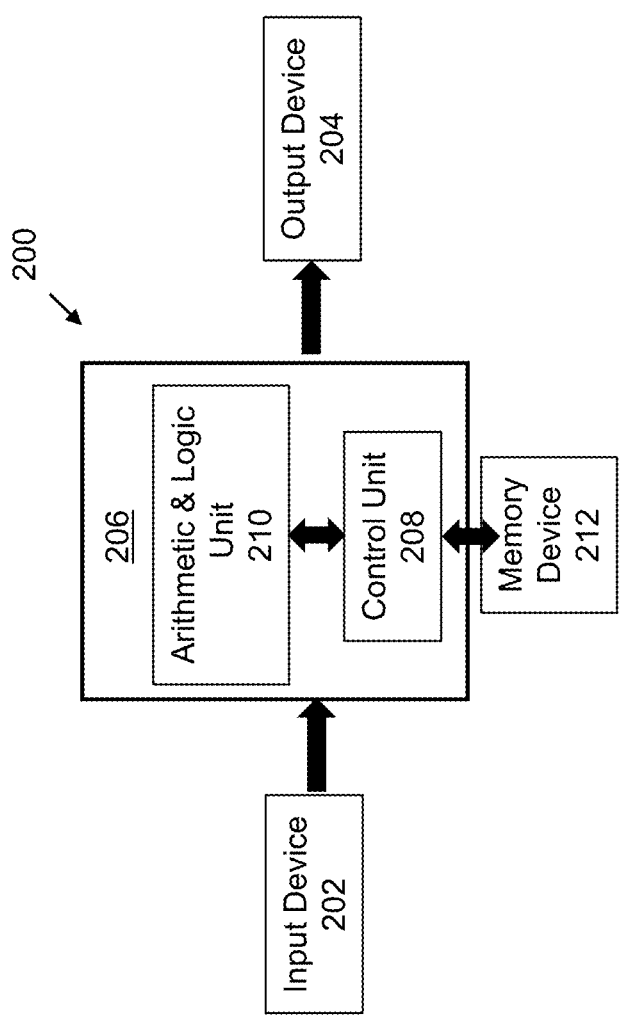
FIG. 11B is a block diagram schematically illustrating a processing device that may be used to perform the method of FIG. 11A.

FIG. 11A is a flow diagram illustrating a method 1100 of designing a MIM capacitor 105 coupled between a first via 101 and a second via 103 in an IC device 100 according to an embodiment of the present disclosure. In various embodiments, the method of FIG. 11A may be implemented using a processing device (e.g., a computer) such as the processing device 200 schematically illustrated in the block diagram of FIG. 11B. Referring to FIG. 11B, a processing device 200 according to various embodiments may include an input device 202 (e.g., a keyboard, mouse, touchscreen device, etc.) and an output device 204 (e.g., a display device, printer, etc.) coupled to a processing unit 206 (e.g., a central processing unit). The processing unit 206 may include a control unit 208 and an arithmetic and logic unit (ALU) 210 and may be coupled to a memory device 212 (e.g., a random access memory (RAM)) that is configured with processor-executable instructions for performing the operations of method 1100. Referring to FIG. 11A, the method 1100 may begin in block 201. In determination block 203, a determination may be made as to whether or not the package resonant frequency of the IC device 100 is greater than a threshold resonant frequency. In various embodiments, the threshold resonant frequency may be between about 50 MHz and about 100 MHz. In one non-limiting example, the threshold resonant frequency may be about 50 MHz.

Referring again to FIG. 11A, in response to a determination that the package resonant frequency is not greater than the threshold frequency (i.e., determination block 203="No"), the method 1100 may proceed to block 205. In block 205, the method 1100 may include determining the capacitance of the MIM capacitor ($C_{MIM}$) based on a total plate count, i, of the MIM capacitor, where i≥2. In various embodiments, the plate count may be a default plate count. In some embodiments, the default plate count may be equal to two. In various embodiments, the determination of the capacitance of the MIM capacitor ($C_{MIM}$) may also be based on a default via-to-via distance between the first via 101 and the second via 103. In various embodiments, the default via-to-via distance may be greater than 5 µm, such as between about 7 µm and about 30 µm. In one non-limiting example, the default via-to-via distance may be about 10 µm. In some embodiments, the default via-to-via distance may be determined, in part, based on an allowable design area of the MIM capacitor. In embodiments, the capacitance of the MIM capacitor ($C_{MIM}$) may be determined via a simulation.

Referring again to FIG. 11A, in determination block 207, a determination may be made as to whether or not the capacitance of the MIM capacitor ($C_{MIM}$) meets pre-determined performance criteria. In some embodiments, the performance criteria may relate to the operating speed of the IC device 100. In response to a determination that the capacitance of the MIM capacitor ($C_{MIM}$) meets the pre-determined performance criteria (i.e., determination block 207="Yes"), then the method 1100 may proceed to block 221, and the final design of the MIM capacitor 105 may be determined in block 221 based on the default plate count and via-to-via distance. In response to a determination that the capacitance of the MIM capacitor ($C_{MIM}$) does not meet the pre-determined performance criteria (i.e., determination block 207="No"), then the method 1100 may proceed to block 209. In block 209, the number of plates, i, of the MIM capacitor design may be incremented by one, and the method 1100 may then return to block 205. In block 205, the capacitance of the MIM capacitor may be determined based on the incremented plate count, i, and the default via-to-via distance, and a determination may be made as to whether or not the capacitance of the MIM capacitor ($C_{MIM}$) with an incremented plate count meets the pre-determined performance criteria in determination block 207. In various embodiments, the method 1100 may include repeatedly incrementing the plate count, i, of the MIM capacitor by one plate in block 209, determining the capacitance of the MIM capacitor in block 205, and determining whether or not the performance criteria is met in determination block 207 until a determination is made that the design of the MIM capacitor meets the performance criteria (i.e., determination block 207="Yes"). Then, the method 1100 may proceed to block 221 and the final design of the MIM capacitor 105 may be determined based on the iterated plate count and the default via-to-via distance.

Referring again to determination block 203 of method 1100, in response to a determination that the package resonant frequency is greater than the threshold frequency (i.e., determination block 203="Yes"), the method 1100 may proceed to block 211. In block 211, the method 1100 may include determining the capacitance of the MIM capacitor ($C_{MIM}$) based on a plate count, i, where i≥2, and a via-to-via distance, d. In various embodiments, the plate count may be a default plate count. In some embodiments, the default plate count may be equal to two. In various embodiments, the via-to-via distance, d, may be a default via-to-via distance. In various embodiments, the default via-to-via distance may be greater than 5 µm, such as between about 7 µm and about 30 µm, although greater and lesser default via-to-via distances are within the contemplated scope of disclosure. In one non-limiting example, the default via-to-via distance may be about 10 µm. In some embodiments, the default via-to-via distance may be determined, in part, based on an allowable design area of the MIM capacitor. In embodiments, the capacitance of the MIM capacitor ($C_{MIM}$) may be determined via a simulation.

Referring again to FIG. 11A, in determination block 213, a determination may be made as to whether or not the capacitance of the MIM capacitor ($C_{MIM}$) meets pre-determined performance criteria. In some embodiments, the performance criteria may relate to the operating speed of the IC device 100. In response to a determination that the capacitance of the MIM capacitor ($C_{MIM}$) meets the pre-determined performance criteria (i.e., determination block 213="Yes"), then the method 1100 may proceed to block 221, and the final design of the MIM capacitor 105 may be determined in block 221 based on the default plate count and the default via-to-via distance. In response to a determination that the capacitance of the MIM capacitor ($C_{MIM}$) does not meet the pre-determined performance criteria (i.e., determination block 213="No"), then the method 1100 may proceed to determination block 215.

In determination block 215, a determination may be made as to whether or not the via-to-via distance, d, is less than a threshold distance. In various embodiments, the threshold distance may be less than 10 µm, such as between about 3 µm and about 9 µm. In one non-limiting example, the threshold via-to-via distance, d, may be about 5 µm. In response to a determination that the capacitance of the MIM capacitor ($C_{MIM}$) does not meet the pre-determined performance criteria (i.e., determination block 215="No"), then the method 1100 may proceed to block 217. In block 217, the via-to-via distance, d, may be decreased by a pre-determined amount (e.g., between 0.1 µm and 3 µm, such as by 1 µm), and the method 1100 may then return to block 211. In block 211, the capacitance of the MIM capacitor may be determined based on the reduced via-to-via distance, and a determination may be made as to whether or not the capacitance of the MIM capacitor ($C_{MIM}$) with the decreased via-to-via distance, d, meets the pre-determined performance criteria in determination block 213. In response to a determination that the capacitance of the MIM capacitor ($C_{MIM}$) meets the pre-determined performance criteria (i.e., determination block 213="Yes"), then the method 1100 may proceed to block 221, and the final design of the MIM capacitor 105 may be determined in block 221 based on the default plate count and the reduced via-to-via distance. In response to a determination that the capacitance of the MIM capacitor ($C_{MIM}$) does not meet the pre-determined performance criteria (i.e., determination block 213="No"), then the method 1100 may proceed to determination block 215 to determine whether the reduced via-to-via distance is less than the threshold distance.

In various embodiments, the method 1100 may include repeatedly decreasing the via-to-via distance, d, in block 215 in response to determining that the via-to-via distance, d, is not less than the threshold distance (i.e., determination block 215="No"), determining the capacitance of the MIM capacitor with the reduced via-to-via distance, d, in block 211, and determining whether or not the performance criteria is met in determination block 213 until either a determination is made that the design of the MIM capacitor meets the performance criteria (i.e., determination block 213="Yes") or a determination is made that the via-to-via distance, d, is less than the threshold distance (i.e., determination block 215="Yes").

In response to a determination that the via-to-via distance, d, is less than the threshold distance (i.e., determination block 215="Yes"), then the method 1100 may proceed to block 219. In block 219, the number of plates, i, of the MIM capacitor design may be incremented by one, and the method 1100 may then return to block 211. In block 211, the capacitance of the MIM capacitor may be determined based on the incremented plate count, i, and the via-to-via distance, and a determination may be made as to whether or not the capacitance of the MIM capacitor ($C_{MIM}$) with an incremented plate count and the via-to-via distance meets the pre-determined performance criteria in determination block 213. In various embodiments, the method 1100 may include repeatedly incrementing the plate count, i, of the MIM capacitor by one plate in block 219, determining the capacitance of the MIM capacitor in block 211, and determining whether or not the performance criteria is met in determination block 213 until a determination is made that the design of the MIM capacitor meets the performance criteria (i.e., determination block 213="Yes"). Then, the method 1100 may proceed to block 221 and the final design of the MIM capacitor 105 may be determined based on the iterated plate count a the via-to-via distance that is less than the threshold distance.

Figure 12:
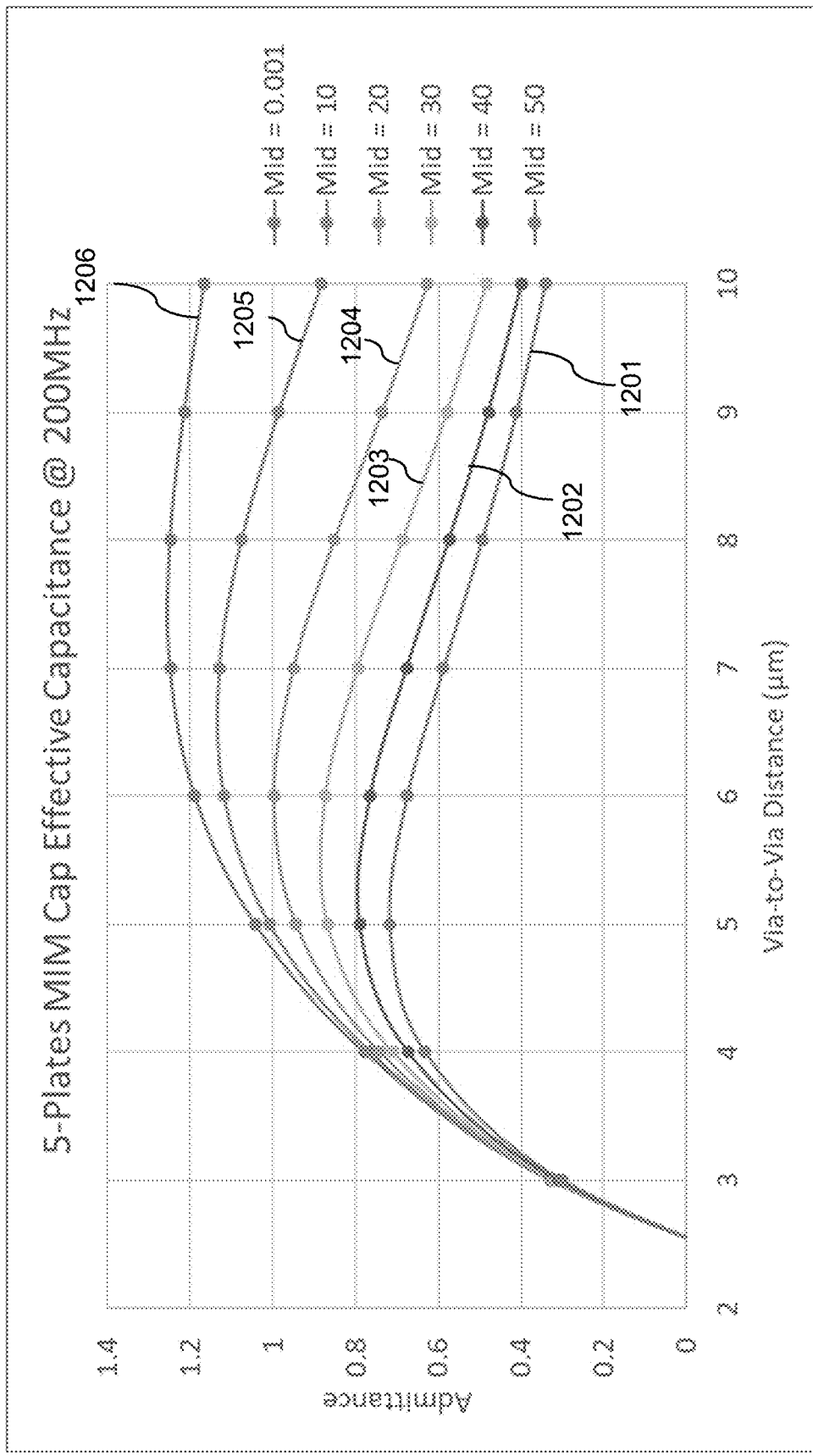
FIG. 12 is a plot showing the admittance of MIM capacitors having different plate thicknesses as a function of via-to-via distance for an IC device packages having a resonant frequency 200 MHz according to an embodiment of the present disclosure.

FIG. 12 is a plot showing the admittance of a MIM capacitor 105 as a function of via-to-via distance for an IC device packages having a resonant frequency 200 MHz. Curves 1201, 1202, 1203, 1204, 1205, and 1206 illustrate the admittance of MIM capacitors 105 having intermediate electrode plates 127 with increasing thicknesses and decreasing resistances. As shown in FIG. 12, thicker intermediate plates 127 provide lower resistance and increased admittance. As described above, lower resistance in the MIM capacitor may increase the effective capacitance.

Figure 13:
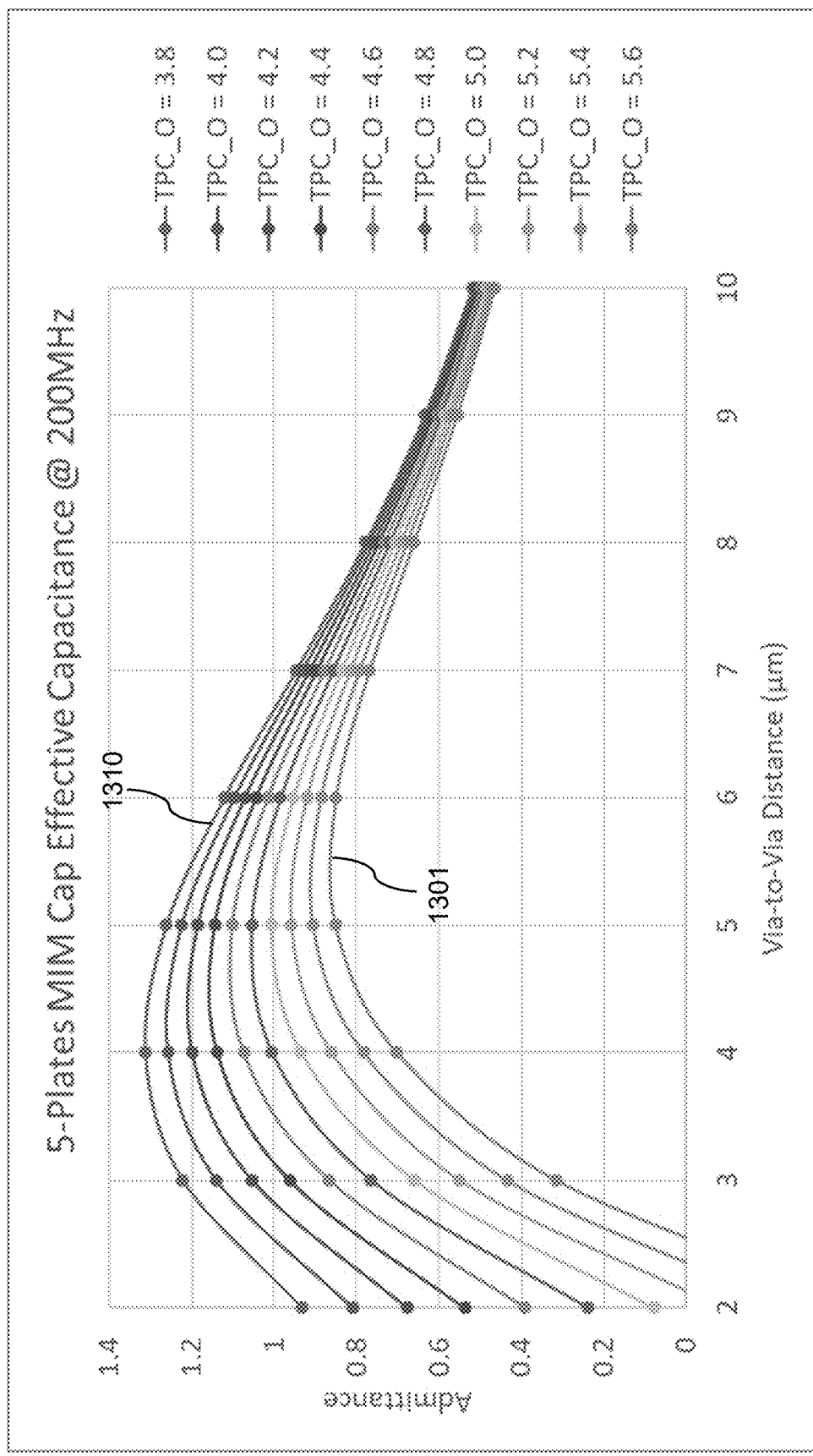
FIG. 13 is a plot showing the admittance of MIM capacitors having different plate opening sizes as a function of via-to-via distance for an IC device packages having a resonant frequency 200 MHz according to an embodiment of the present disclosure.

In some embodiments, the capacitance characteristics of a MIM capacitor 105 may also vary as a function of the size of the plate openings (i.e., the dimensions of the via openings through the capacitor electrode plates). FIG. 13 is a plot showing the admittance of a MIM capacitor 105 as a function of via-to-via distance for an IC device packages having a resonant frequency 200 MHz. Each of the curves illustrates the admittance of MIM capacitors having different sizes of the plate openings. Curve 1301 shows the MIM capacitor having the largest plate openings (TPC_O=5.6 μm plate opening width) and 1310 shows the MIM capacitor having the smallest plate openings (TPC_O=3.8 μm plate opening width). As shown in FIG. 13, smaller plate openings may increase the admittance of the MIM capacitor 105.

Figure 14:
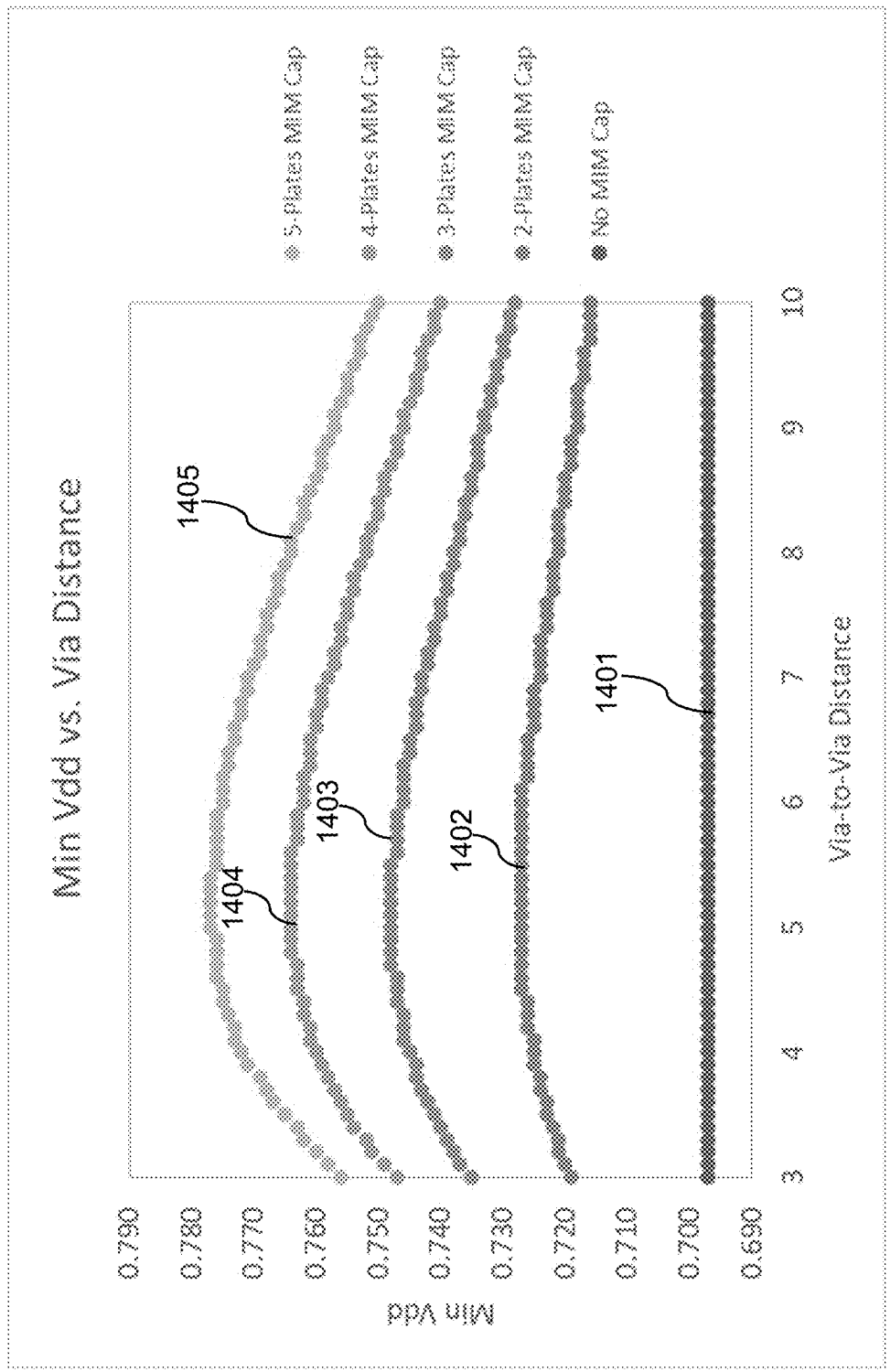
FIG. 14 is a plot showing the minimum $V_{dd}$ as a function of via-to-via distance for an IC device having different MIM capacitors according to an embodiment of the present disclosure.

FIG. 14 is a plot showing the minimum $V_{dd}$ as a function of via-to-via distance for an IC device 100 having a MIM capacitor 105 according to an embodiment of the present disclosure. FIG. 14 demonstrates that a high capacitance density of the MIM capacitor 105 may mitigate the level of chip voltage drop. In the plot of FIG. 14, a 1 volt $V_{dd}$ was applied to a transistor of IC devices 100 having different MIM capacitor configurations, and the voltage drop was measured for each MIM design at different via-to-via distances. Curve 1401 illustrates the voltage drop for an IC device 100 without a MIM capacitor, curve 1402 illustrates the voltage drop for a 2-plate MIM capacitor, curve 1403 illustrates the voltage drop for a 3-plate MIM capacitor, curve 1404 illustrates the voltage drop for a 4-plate MIM capacitor, and curve 1405 illustrates the voltage drop for a 5-plate MIM capacitor. As shown in FIG. 14, the lowest voltage drop was obtained with the 5-plate MIM capacitor.

Figure 15:
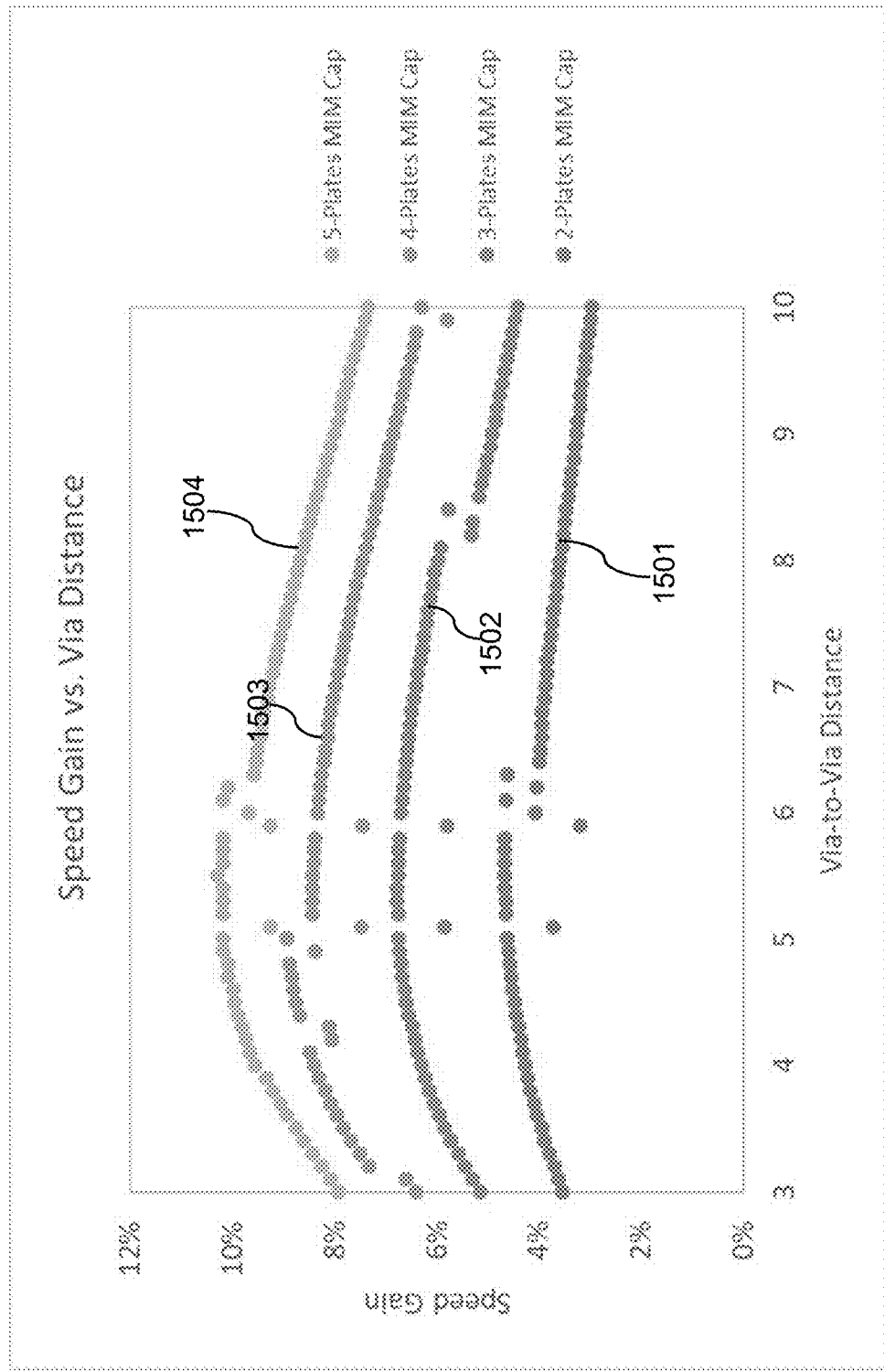
FIG. 15 is a plot showing the percent gain in operating speed of an IC device as a function of via-to-via distance for different MIM capacitor configurations.

FIG. 15 is a plot showing the percent gain in operating speed of an IC device 100 as a function of via-to-via distance for different MIM capacitor configurations. Curve 1501 illustrates the percent speed gain for an IC device 100 having a 2-plate MIM capacitor, curve 1502 illustrates the percent speed gain for an IC device 100 having a 3-plate MIM capacitor, curve 1503 illustrates the percent speed gain for an IC device 100 having a 4-plate MIM capacitor, and curve 1504 illustrates the percent speed gain for an IC device 100 having a 5-plate MIM capacitor. As shown in FIG. 15, a 5-plate MIM capacitor according to various embodiments of the present disclosure may provide an ~10% performance boost for the IC device 100. This increase in operating speed may be due in part to the smaller voltage drop (i.e., higher minimum $V_{dd}$) for the 5-plate MIM capacitor. FIG. 15 also shows that the highest increase in device performance may be obtained with a via-to-via distance of ~5 μm.

Figure 16:
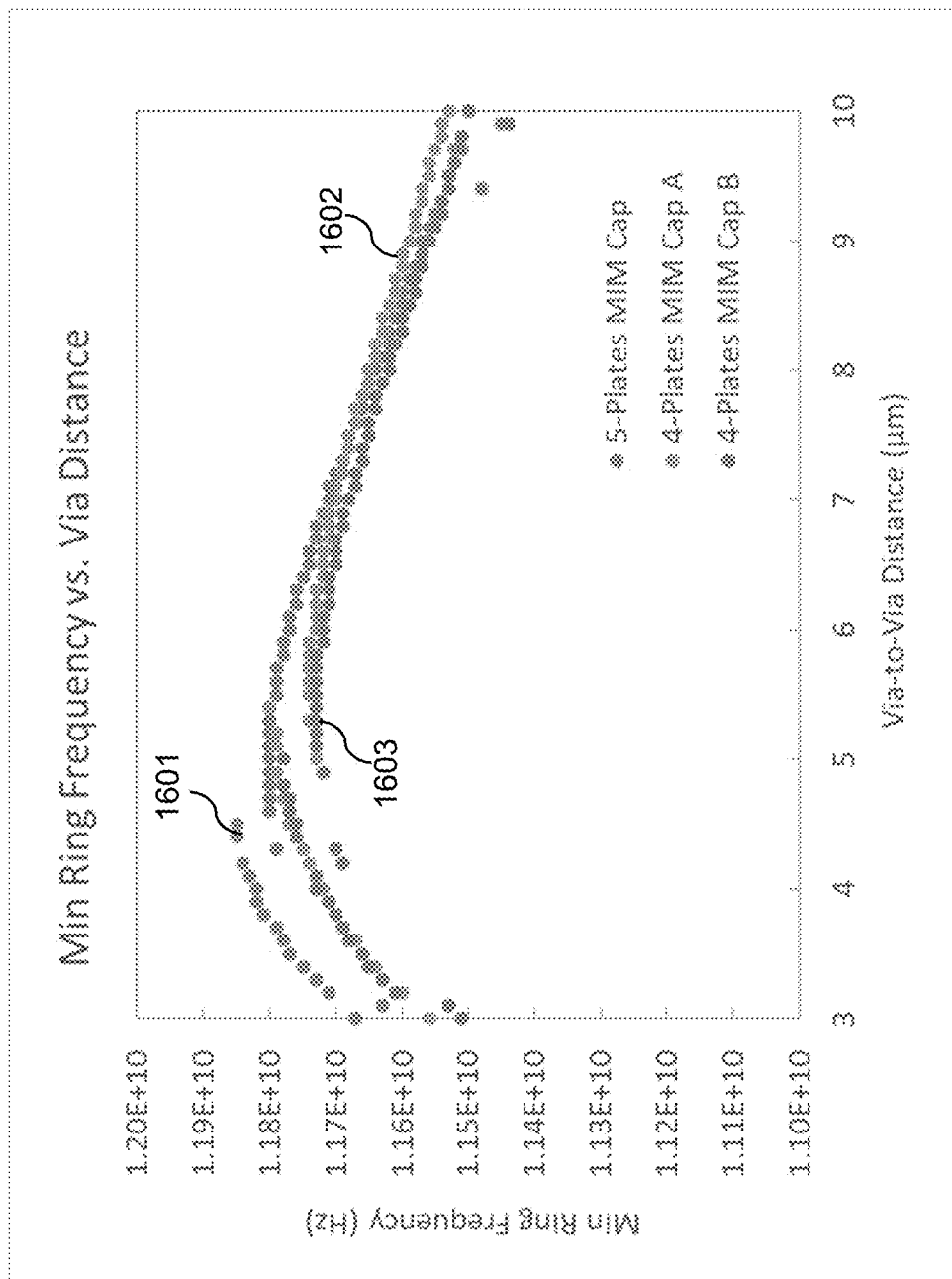
FIG. 16 is a plot showing the minimum ring frequency of an IC device as a function of via-to-via distance for different MIM capacitor configurations.

FIG. 16 is a plot showing the minimum ring frequency of an IC device 100 as a function of via-to-via distance for different MIM capacitor configurations. The minimum ring frequency may represent the operating frequency of the IC device 100. Curve 1601 illustrates the minimum ring frequency for a 5-plate MIM capacitor 105 having thick intermediate plates, curve 1602 illustrates the minimum ring frequency for a 4-plate MIM capacitor 105 having thick intermediate plates, and curve 1603 illustrates the minimum ring frequency for a 4-plate MIM capacitor 105 having intermediate plates that are thinner than the capacitor shown in curve 1602. As shown in FIG. 16, lower electrode plate resistance and higher plate counts may offer faster design frequency.

Figure 17A:
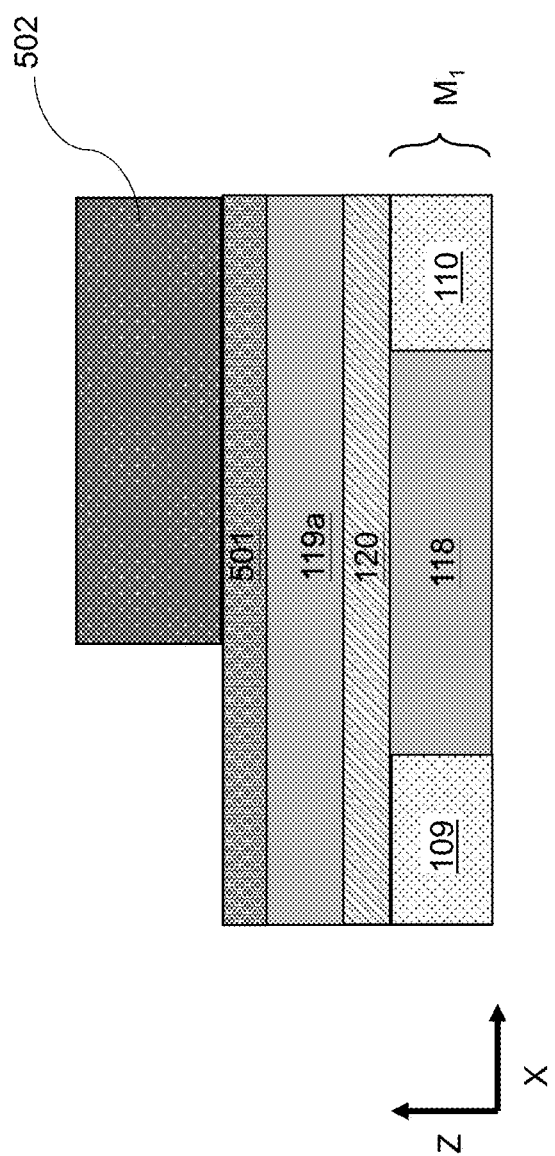
FIGS. 17A-17Q are sequential vertical cross-sectional views illustrating an exemplary structure during formation of a MIM capacitor according to various embodiments of the present disclosure.
Figure 17B:
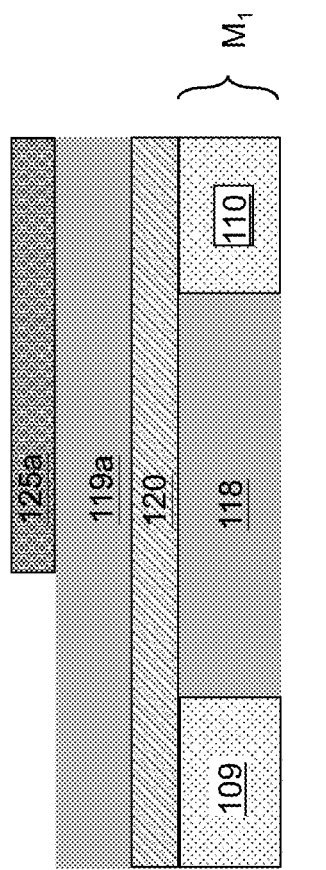
Figure 17C:
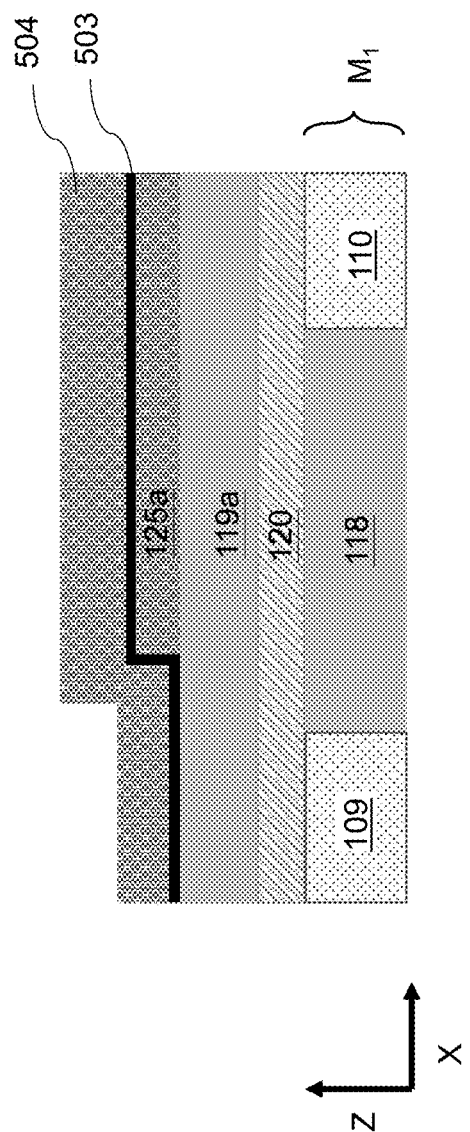
Figure 17D:
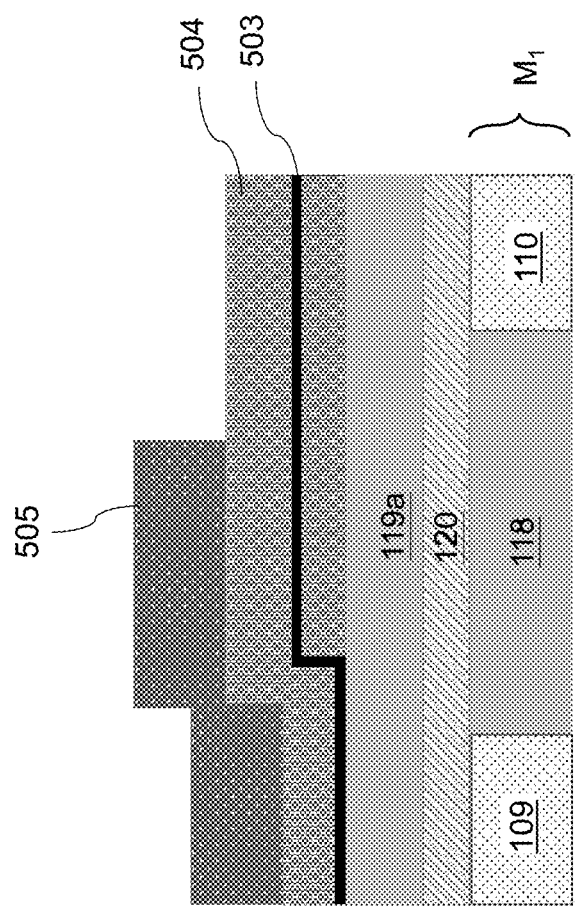
Figure 17E:
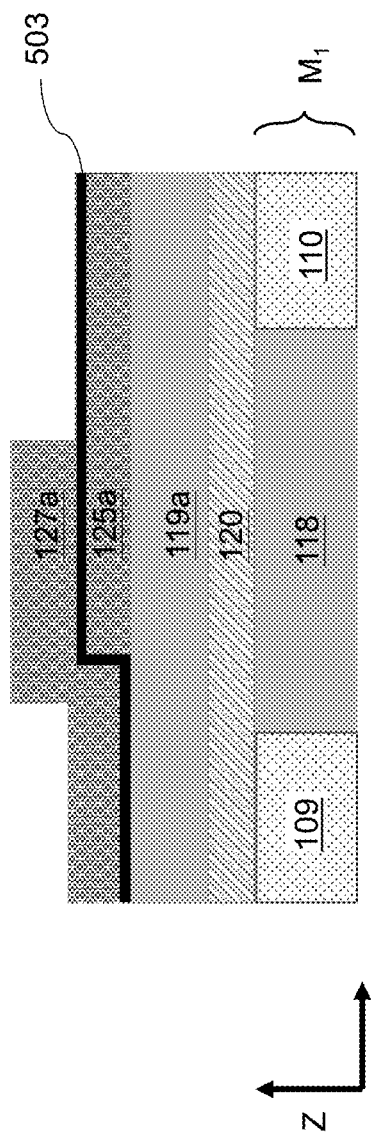
Figure 17F:
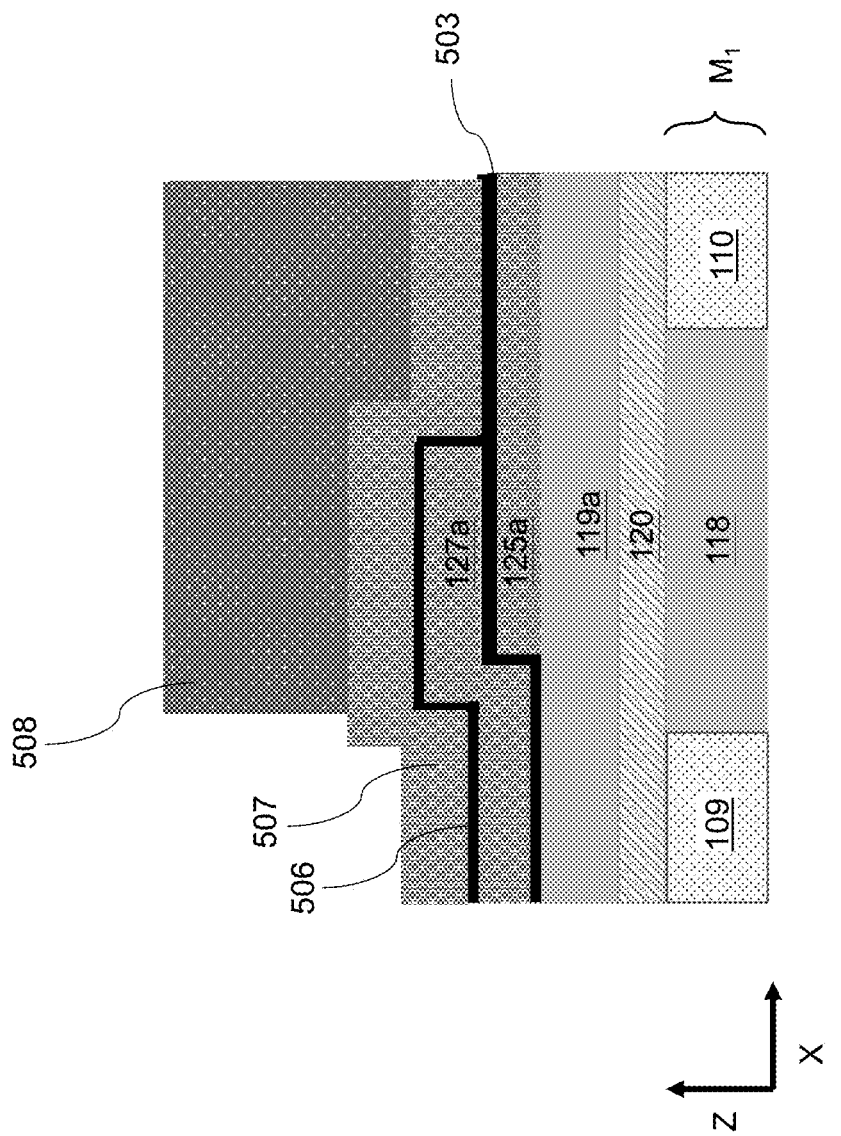
Figure 17G:
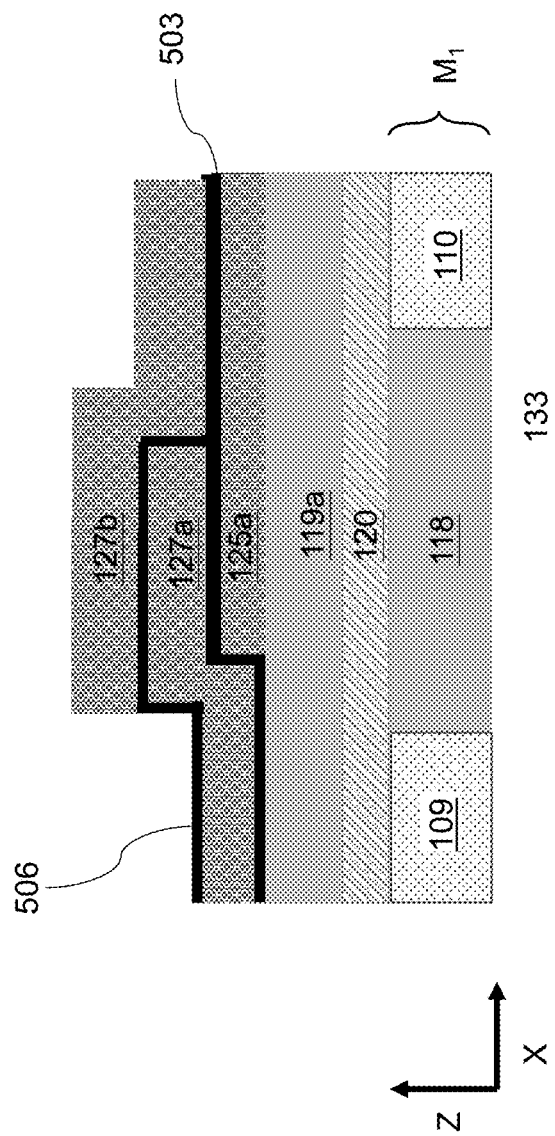
Figure 17H:
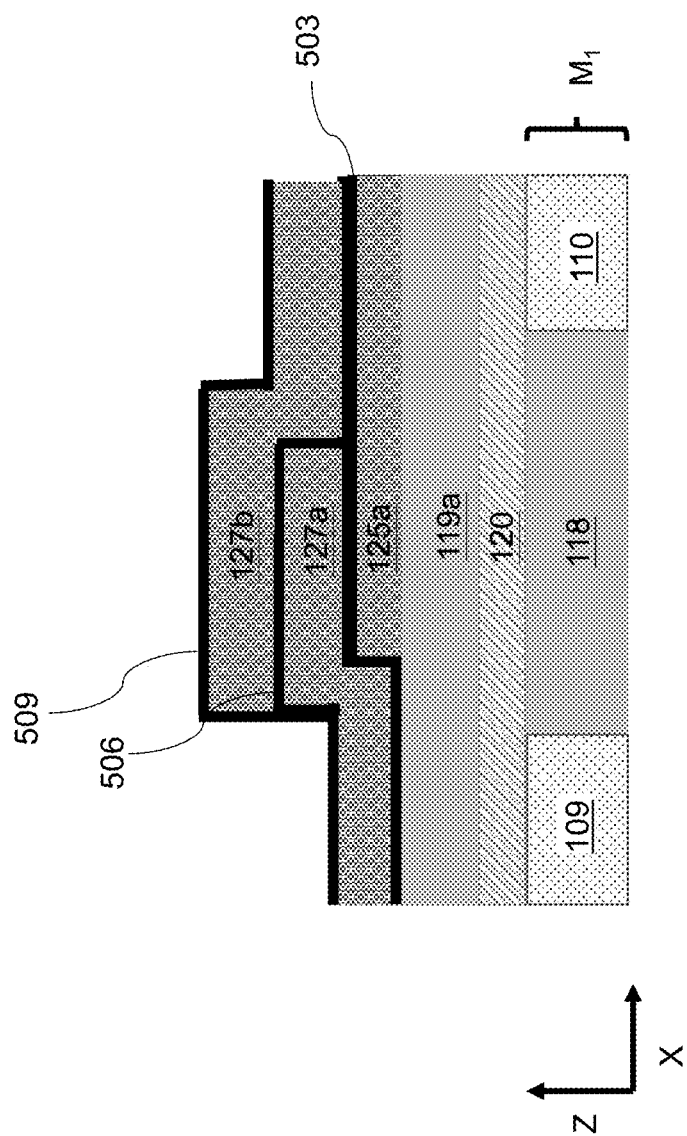
Figure 17I:
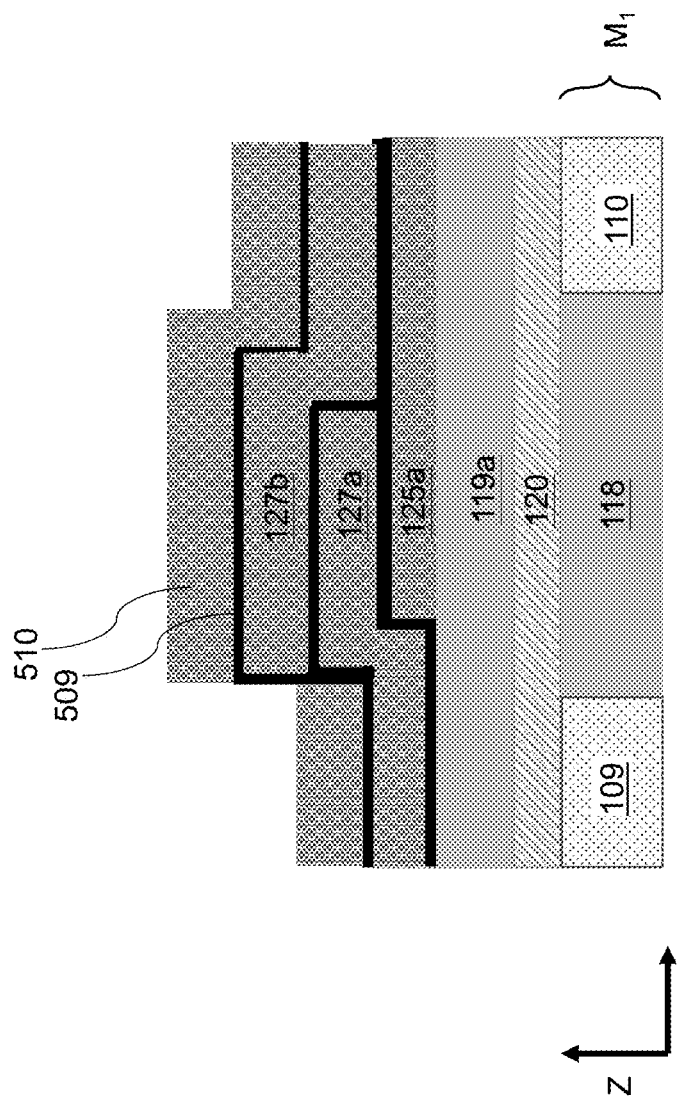
Figure 17J:
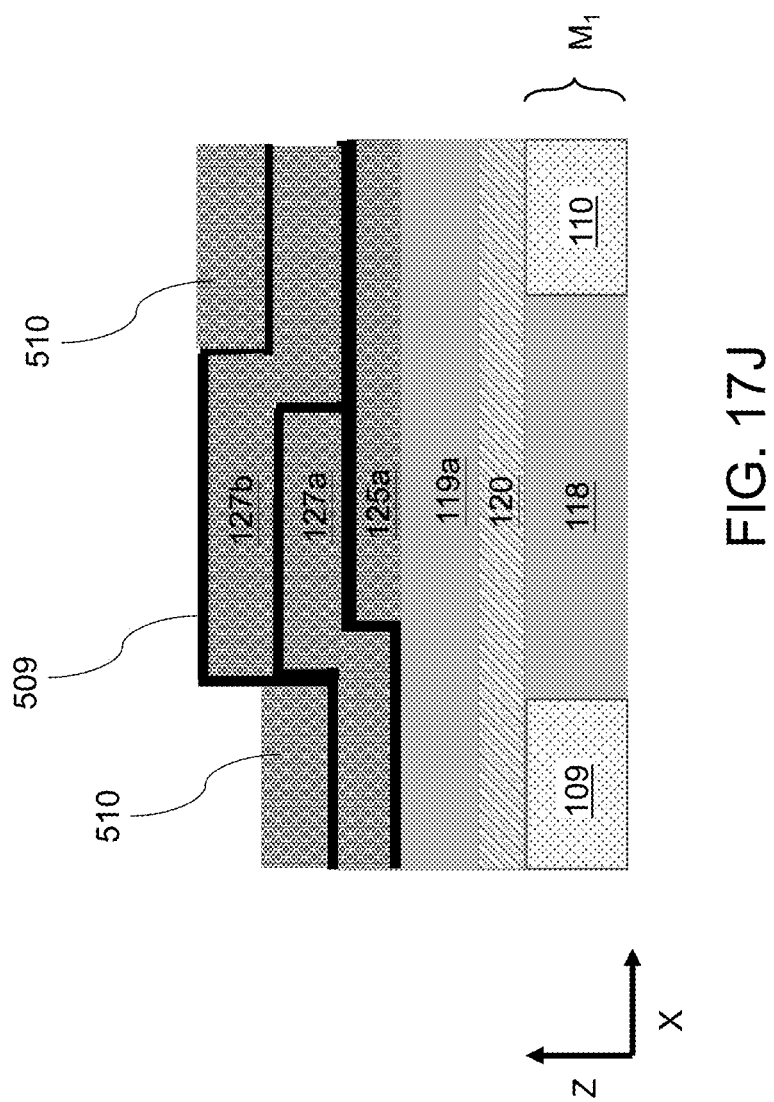
Figure 17K:
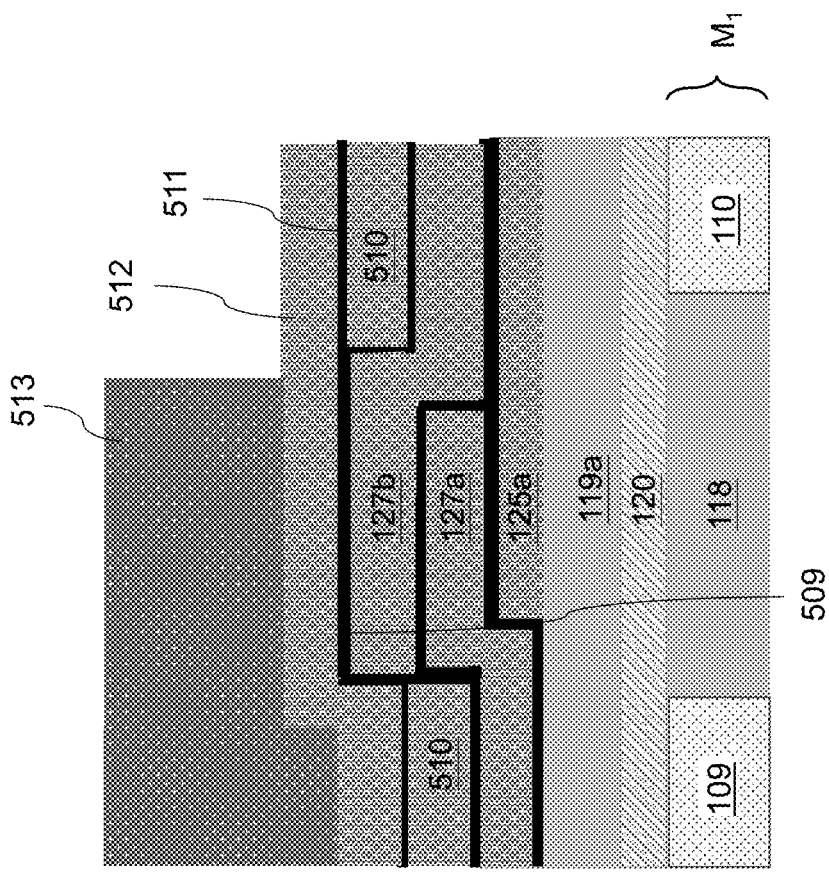
Figure 17L:
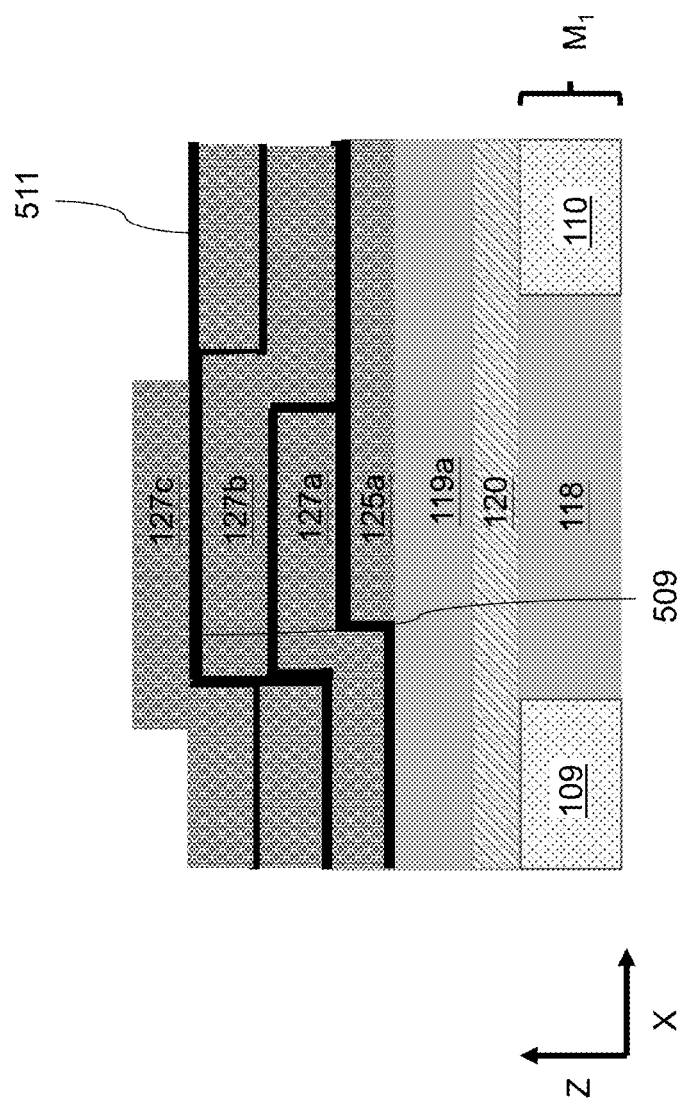
Figure 17M:
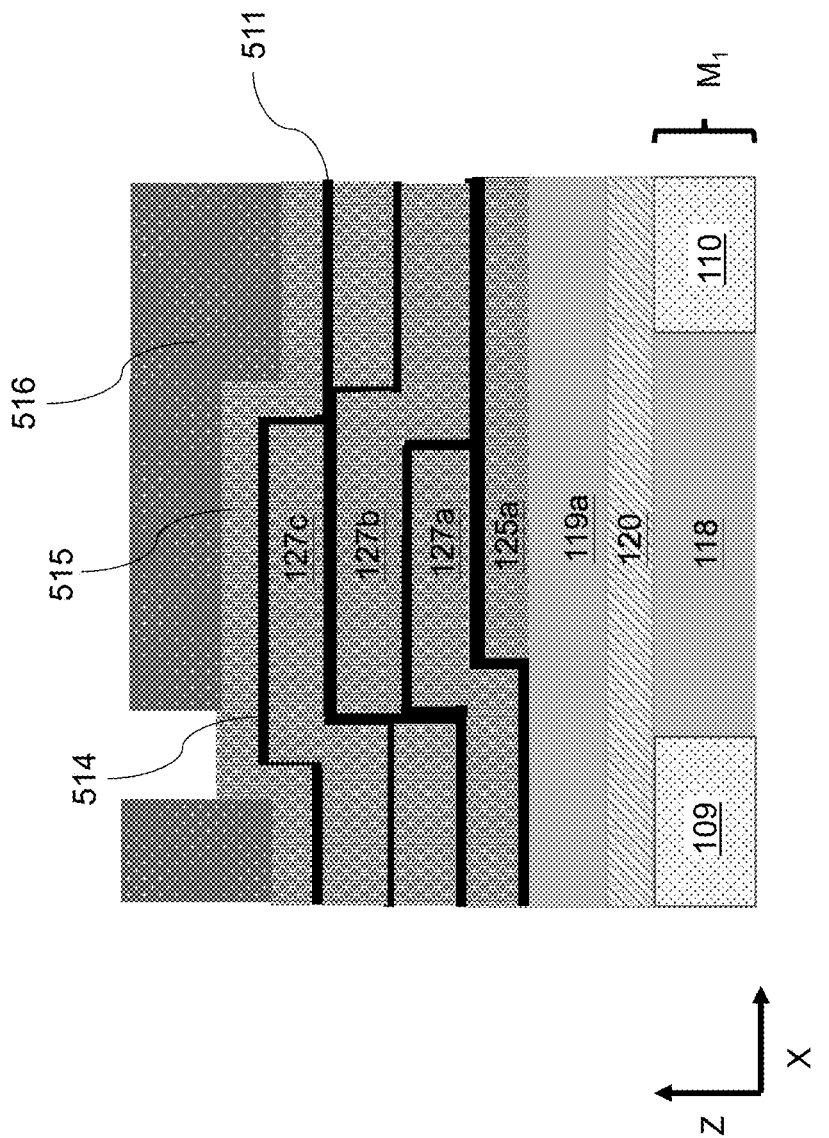
Figure 17N:
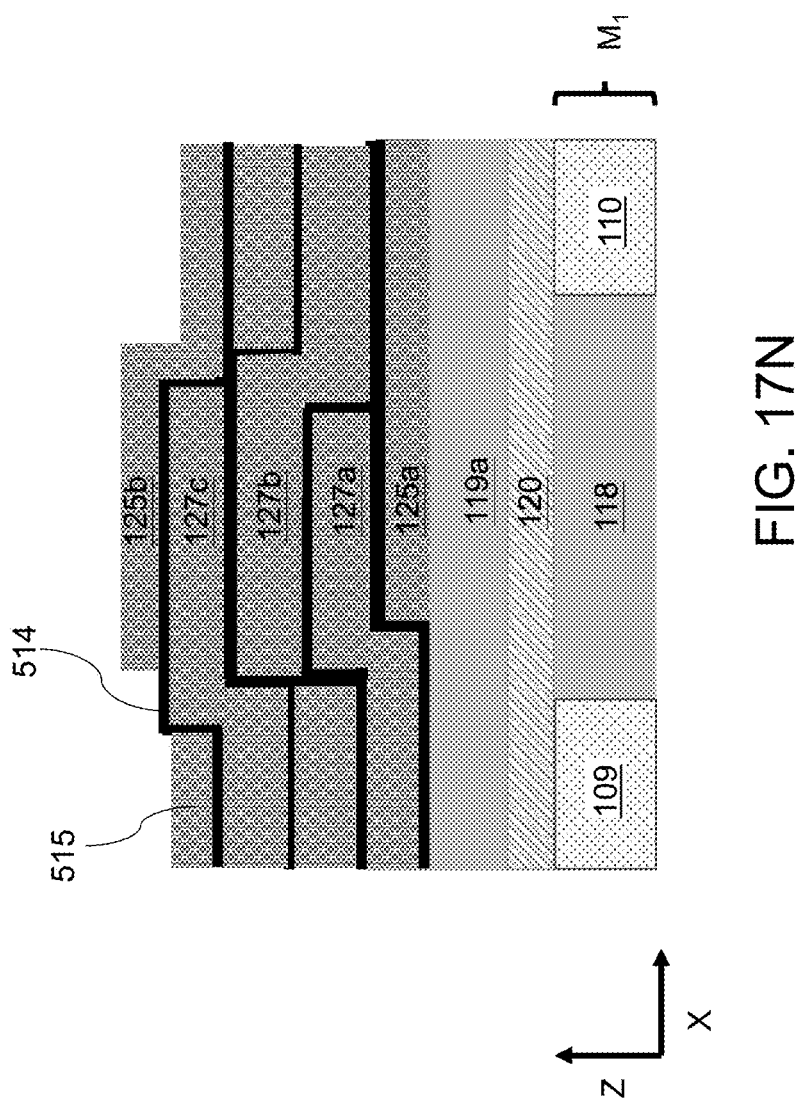
Figure 17O:
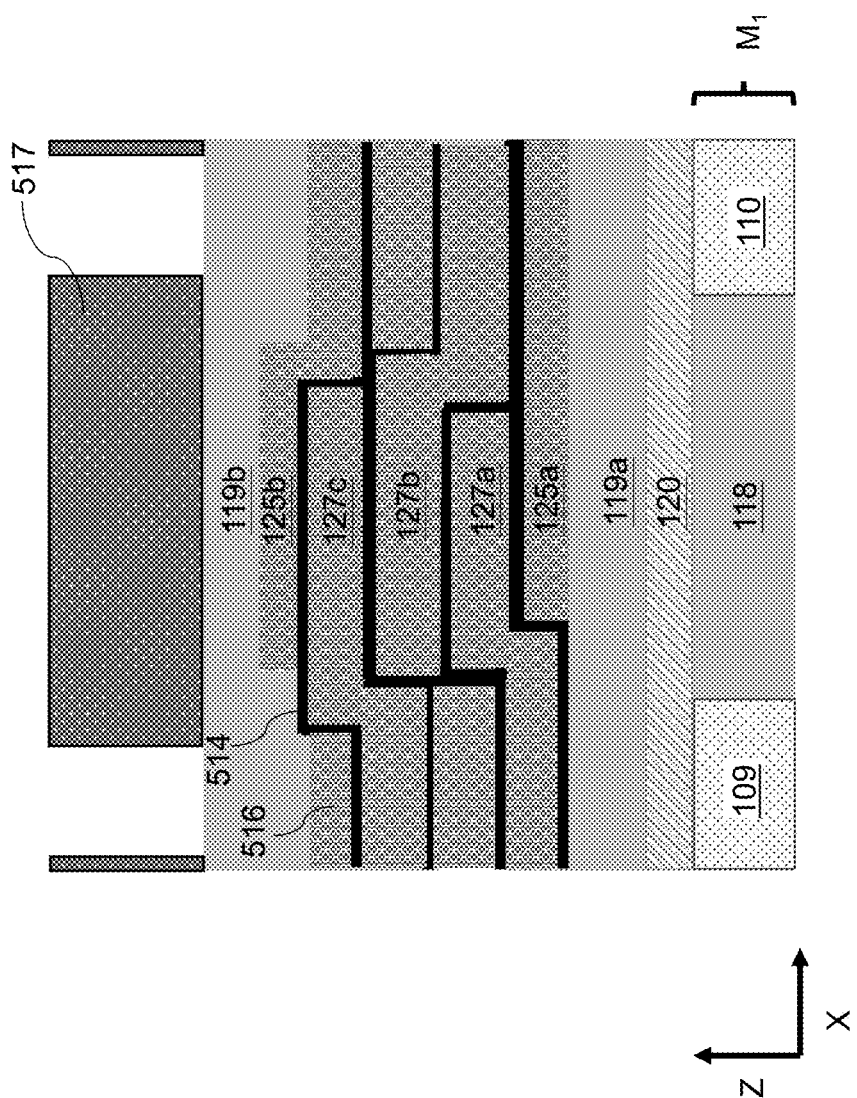
Figure 17P:
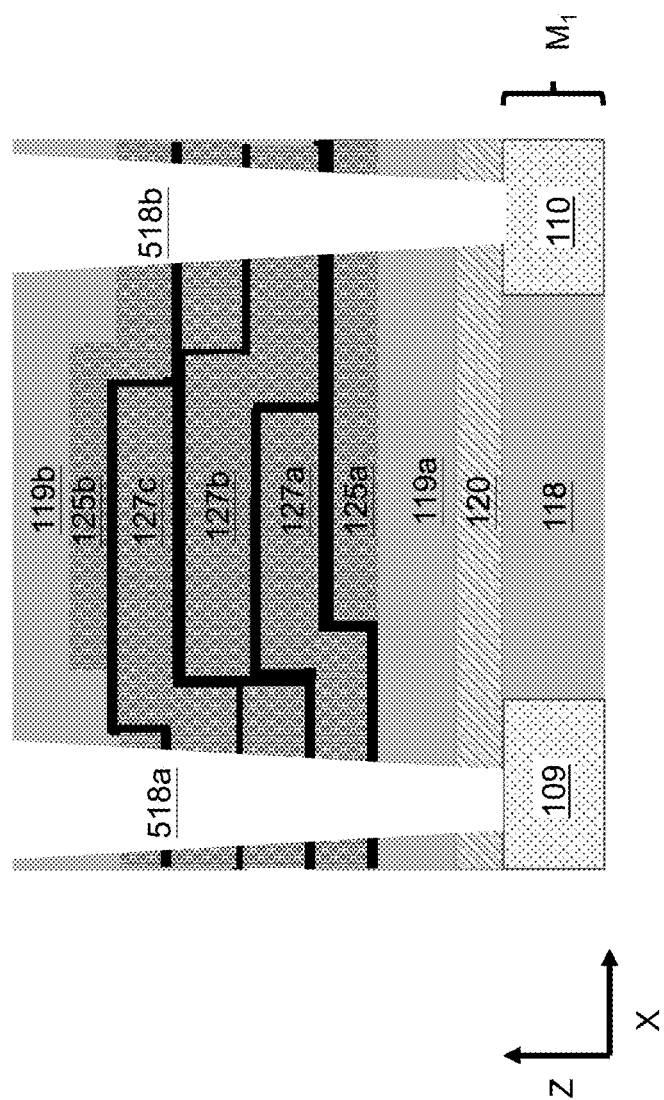
Figure 17Q:
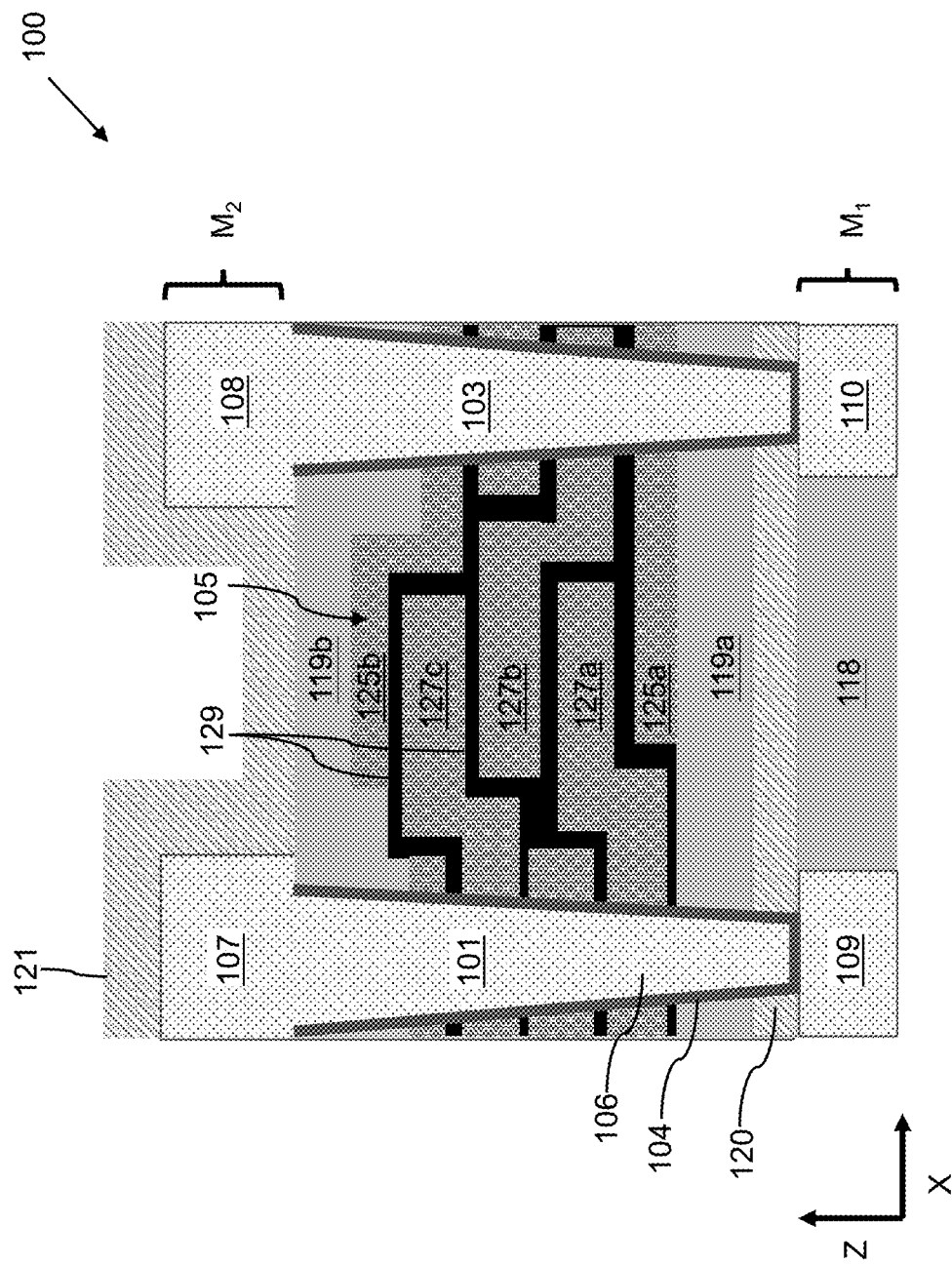

FIGS. 17A-17Q are sequential vertical cross-sectional views illustrating an exemplary structure during formation of a MIM capacitor 105 according to various embodiments of the present disclosure. Referring to FIG. 17A, a first dielectric material layer 120, a second dielectric material layer 119a and a first metal layer 501 may be conformally deposited over a metal level $M_1$ of an interconnect structure of an IC device 100. The first and second dielectric material layers 120 and 119a may be composed of suitable dielectric materials, such as silicon oxide ($SiO_2$), silicon nitride (SiN, $Si_3N_4$), silicon carbide (SiC), undoped silicate glass (USG), a doped silicate glass, organosilicate glass, amorphous fluorinated carbon, porous variants thereof, or combinations thereof. Other dielectric materials are within the contemplated scope of disclosure. In one embodiment, dielectric material layer 119a may include silicon oxide, and dielectric material layer 120 may include silicon nitride. In some embodiments, dielectric material layer 119a may include silicon oxide that is deposited via plasma enhanced CVD (PE-CVD) using a suitable precursor, such as TEOS.

The first metal layer 501 may include a suitable electrically conductive material, such as such as copper (Cu), tungsten (W), aluminum (Al), aluminum copper (AlCu), aluminum silicon copper (AlSiCu), cobalt (Co), ruthenium (Ru), molybdenum (Mo), tantalum (Ta), titanium (Ti), alloys thereof, combinations thereof, or the like. Other electrically conductive materials are within the contemplated scope of disclosure.

The first dielectric layer 120 the second dielectric layer 119a and the first metal layer 501 may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

Referring again to FIG. 17A, a patterned mask 502 may be formed over an upper surface of the first metal layer 501. The patterned mask 502 may be lithographically patterned to form at least one opening through the mask 502 that exposes an upper surface of the first metal layer 501.

FIG. 17B is a vertical cross-sectional view of the exemplary structure showing a bottom electrode plate 125a for a MIM capacitor over the second dielectric layer 119a. Referring to FIG. 17B, an anisotropic etch process may be performed through the patterned mask 502 to remove portions of the first metal layer 501 and form a bottom electrode plate 125a for a MIM capacitor. Following the etch process, the patterned mask 502 may be removed using a suitable process, such as by ashing or dissolution with a solvent.

FIG. 17C is a vertical cross-sectional view of the exemplary structure showing a dielectric material layer 503 over the upper surface of the second dielectric layer 119a and over the side surface and upper surface of the bottom electrode plate 125a, and a second metal layer 504 over the upper surface of the dielectric material layer 503. Referring to FIG. 17C, dielectric material layer 503 may be conformally deposited over the upper surface of the second dielectric layer 119a, the side surface of the bottom electrode plate 125a and over the upper surface of the bottom electrode plate 125a using a suitable deposition process, as described above. In embodiments, dielectric material layer 503 may be composed of a different dielectric material than second dielectric material layer 119a. In some embodiments, dielectric material layer 503 may be composed of a high-k dielectric material. Examples of high-k dielectric materials include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), titanium oxide ($TiO_2$), alumina ($Al_2O_3$), hafnium dioxide-alumina ($HfO_2$—$Al_2O_3$), tantalum oxide ($Ta_2O_5$), $SiO_x$/$SiN_y$/$SiO_x$ or ferroelectrics. Other suitable dielectric materials are within the contemplated scope of disclosure.

Referring again to FIG. 17C, the second metal layer 504 may be conformally deposited over the dielectric material layer 503 using a suitable deposition process as described above. The second metal layer 504 may include a suitable electrically conductive material, and may be composed of the same material(s) or different material(s) as the bottom electrode plate 125a. The second metal layer 504 may have a thickness that is greater than a thickness of the bottom electrode plate 125a.

FIG. 17D is a vertical cross-sectional view of the exemplary structure showing a patterned mask 505 over the upper surface of the second metal layer 504. The patterned mask 505 may be lithographically patterned to form at least one opening through the mask 505 that exposes an upper surface of the second metal layer 504.

FIG. 17E is a vertical cross-sectional view of the exemplary structure showing a first intermediate electrode plate 127a for a MIM capacitor over dielectric material layer 503. Referring to FIG. 17E, an anisotropic etch process may be performed through the patterned mask 505 to remove portions of the second metal layer 504 and form a first intermediate electrode plate 127a for a MIM capacitor. The first intermediate electrode plate 127a may be separated from the bottom electrode plate 125a by dielectric material layer 503, and the first intermediate electrode plate 127a may have a thickness that is greater than the thickness of the bottom electrode plate 125a. Following the etch process, the patterned mask 505 may be removed using a suitable process, such as by ashing or dissolution with a solvent.

FIG. 17F is a vertical cross-sectional view of the exemplary structure showing a dielectric material layer 506 and a third metal layer 507 formed over the first intermediate electrode plate 127a and the bottom electrode plate 125a, and a patterned mask 508 formed over the third metal layer 507. Referring to FIG. 17F, dielectric material layer 506 may be conformally deposited over the upper surfaces and the side surfaces of the first intermediate electrode plate 127a, and over the exposed upper surface of dielectric material layer 503, using a suitable deposition process, as described above. In embodiments, dielectric material layer 506 may be composed of a suitable dielectric material, such as a high-k dielectric material as described above.

Referring again to FIG. 17F, the third metal layer 507 may be conformally deposited over the dielectric material layer 506 using a suitable deposition process as described above. The third metal layer 507 may include a suitable electrically conductive material, and may be composed of the same material(s) or different material(s) as the bottom electrode plate 125a and/or the first intermediate electrode plate 127a. The third metal layer 507 may have a thickness that is greater than a thickness of the bottom electrode plate 125a. The patterned mask 508 may be formed over the third metal layer 507, and may be lithographically patterned to form at least one opening through the mask 508 that exposes an upper surface of the third metal layer 507.

FIG. 17G is a vertical cross-sectional view of the exemplary structure showing a second intermediate electrode plate 127b for a MIM capacitor over dielectric material layer 506. Referring to FIG. 17G, an anisotropic etch process may be performed through the patterned mask 508 to remove portions of the third metal layer 507 and form a second intermediate electrode plate 127b for a MIM capacitor. The second intermediate electrode plate 127b may be separated from the first intermediate electrode plate 127a by dielectric material layer 506, and may be separated from the bottom electrode plate 125a by dielectric material layers 503 and 506. The second intermediate electrode plate 127b may have a thickness that is greater than the thickness of the bottom electrode plate 125a. Following the etch process, the patterned mask 508 may be removed using a suitable process, such as by ashing or dissolution with a solvent.

FIG. 17H is a vertical cross-sectional view of the exemplary structure showing a dielectric material layer 509 formed over the second intermediate electrode plate 127b and the first intermediate electrode plate 127a. Referring to FIG. 17H, dielectric material layer 509 may be conformally deposited over the exposed surfaces of dielectric material layer 506 on the first intermediate electrode plate 127a and over the side surfaces and the upper surfaces of the second intermediate electrode plate 127b using a suitable deposition process, as described above. In embodiments, dielectric material layer 509 may be composed of a suitable dielectric material, such as a high-k dielectric material as described above.

FIG. 17I is a vertical cross-sectional view of the exemplary structure showing a fourth metal layer 510 over dielectric material layer 509. The fourth metal layer 510 may be conformally deposited over the dielectric material layer 509 using a suitable deposition process as described above. The fourth metal layer 510 may include a suitable electrically conductive material, and may be composed of the same material(s) or different material(s) as the bottom electrode plate 125a, the first intermediate electrode plate 127a, and/or the second intermediate electrode plate 127b.

FIG. 17J is a vertical cross-sectional view of the exemplary structure following a planarization process to remove portions of the fourth metal layer 510 from over an upper surface of dielectric material layer 509. Referring to FIG. 17J, a planarization process, such as a chemical mechanical planarization (CMP) process, may be used to remove portions of the fourth metal layer 510 and expose the upper surface of dielectric material layer 509.

FIG. 17K is a vertical cross-sectional view of the exemplary structure showing a dielectric material layer 511 and a fifth metal layer 512 formed over the fourth metal layer 510 and dielectric material layer 509, and a patterned mask 513 formed over the fifth metal layer 512. Referring to FIG. 17K, dielectric material layer 511 may be conformally deposited over the exposed surfaces of the fourth metal layer 510 and the dielectric material layer 509 using a suitable deposition process, as described above. In embodiments, dielectric material layer 511 may be composed of a suitable dielectric material, such as a high-k dielectric material as described above. The fifth metal layer 512 may be conformally deposited over the dielectric material layer 511 using a suitable deposition process as described above. The fifth metal layer 512 may include a suitable electrically conductive material, and may be composed of the same material(s) or different material(s) as the bottom electrode plate 125a, the first intermediate electrode plate 127a, and/or the second intermediate electrode plate 127b. The fifth metal layer 512 may have a thickness that is greater than a thickness of the bottom electrode plate 125a. The patterned mask 513 may be formed over the fifth metal layer 512, and may be lithographically patterned to form at least one opening through the mask 513 that exposes an upper surface of the fifth metal layer 512.

FIG. 17L is a vertical cross-sectional view of the exemplary structure showing a third intermediate electrode plate 127c for a MIM capacitor over dielectric material layer 511. Referring to FIG. 17L, an anisotropic etch process may be performed through the patterned mask 513 to remove portions of the fifth metal layer 512 and form a third intermediate electrode plate 127c for a MIM capacitor. The third intermediate electrode plate 127c may be separated from the second intermediate electrode plate 127b by dielectric material layers 509 and 511. The third intermediate electrode plate 127c may have a thickness that is greater than the thickness of the bottom electrode plate 125a. Following the etch process, the patterned mask 513 may be removed using a suitable process, such as by ashing or dissolution with a solvent.

FIG. 17M is a vertical cross-sectional view of the exemplary structure showing a dielectric material layer 514 and a sixth metal layer 515 formed over the third intermediate electrode plate 127c, and a patterned mask 516 formed over the sixth metal layer 515. Referring to FIG. 17M, dielectric material layer 514 may be conformally deposited over the upper surfaces and the side surfaces of the third intermediate electrode plate 127c, and over the exposed upper surface of dielectric material layer 511, using a suitable deposition process, as described above. In embodiments, dielectric material layer 514 may be composed of a suitable dielectric material, such as a high-k dielectric material as described above.

Referring again to FIG. 17M, the sixth metal layer 515 may be conformally deposited over the dielectric material layer 514 using a suitable deposition process as described above. The sixth metal layer 515 may include a suitable electrically conductive material, and may be composed of the same material(s) or different material(s) as the bottom electrode plate 125a, the first intermediate electrode plate 127a, the second intermediate electrode plate 127b and/or the third intermediate electrode plate 127c. The sixth metal layer 515 may have a thickness that is less than a thickness of the first intermediate electrode plate 127a, the second intermediate electrode plate 127b and the third intermediate electrode plate 127c. The patterned mask 516 may be formed over the sixth metal layer 515, and may be lithographically patterned to form at least one opening through the mask 516 that exposes an upper surface of the sixth metal layer 515.

FIG. 17N is a vertical cross-sectional view of the exemplary structure showing a top electrode plate 125b for a MIM capacitor over dielectric material layer 514. Referring to FIG. 17N, an anisotropic etch process may be performed through the patterned mask 516 to remove portions of the sixth metal layer 515 and form a top electrode plate 125b for a MIM capacitor. The top electrode plate 125b may be separated from the third intermediate electrode plate 127c by dielectric material layer 514. The top electrode plate 125b may have a thickness that is less than the thickness of the first intermediate electrode plate 127a, the second intermediate electrode plate 127b and the third intermediate electrode plate 127c. Following the etch process, the patterned mask 516 may be removed using a suitable process, such as by ashing or dissolution with a solvent.

FIG. 17O is a vertical cross-sectional view of the exemplary structure showing a dielectric layer 119b over the top electrode plate 125b and a patterned mask 517 over the dielectric layer 119b. Referring to FIG. 17O, dielectric layer 119b may be deposited over the exposed upper surfaces of the sixth metal layer 515, the dielectric material layer 514 and the top electrode plate 125b. Dielectric layer 119b may optionally undergo a planarization process to provide a planar upper surface of dielectric layer 119b. Dielectric layer 119b may be deposited using a suitable deposition process as described above. In embodiments, dielectric layer 119b may be composed of the same material as dielectric layer 119a. In some embodiments, dielectric layer 119b may include silicon oxide. Other suitable dielectric materials are within the contemplated scope of disclosure.

Referring again to FIG. 17O, the patterned mask 517 may be formed over dielectric layer 119b, and may be lithographically patterned to form at least one opening through the mask 517 that exposes an upper surface of dielectric material layer 119b.

FIG. 17P is a vertical cross-sectional view of the exemplary structure showing via openings 518 formed through dielectric material layers 119b, 119a, 120 and the electrode plates 125b, 127c, 127b, 127a, 125a of the MIM capacitor structure to expose metal features 109, 110 of the underlying metal level, $M_1$. Referring to FIG. 17P, an anisotropic etch process may be performed through the patterned mask 517 to remove portions of the dielectric material layers 119b, 119a, 120 and the electrode plates 125b, 127c, 127b, 127a, 125a and form via openings 518a and 518b. Via opening 518a may expose portions of intermediate electrode plates 127c and 127a on a sidewall of the via opening 518a, and via opening 518b may expose portions of the top electrode plate 125b, intermediate electrode plate 127b, and the bottom electrode plate 125a on a sidewall of the via opening 518b. Following the etch process, the patterned mask 517 may be removed using a suitable process, such as by ashing or dissolution with a solvent.

FIG. 17Q is a vertical cross-sectional view of the exemplary structure showing conductive vias 101 and 103 formed in the via openings 518a and 518b and an upper metal level, $M_2$, formed over the conductive vias 101, 103 and dielectric layer 119b to form an IC device 100 including a MIM capacitor 105, such as described above with reference to FIGS. 1A-1C.

Figure 18:
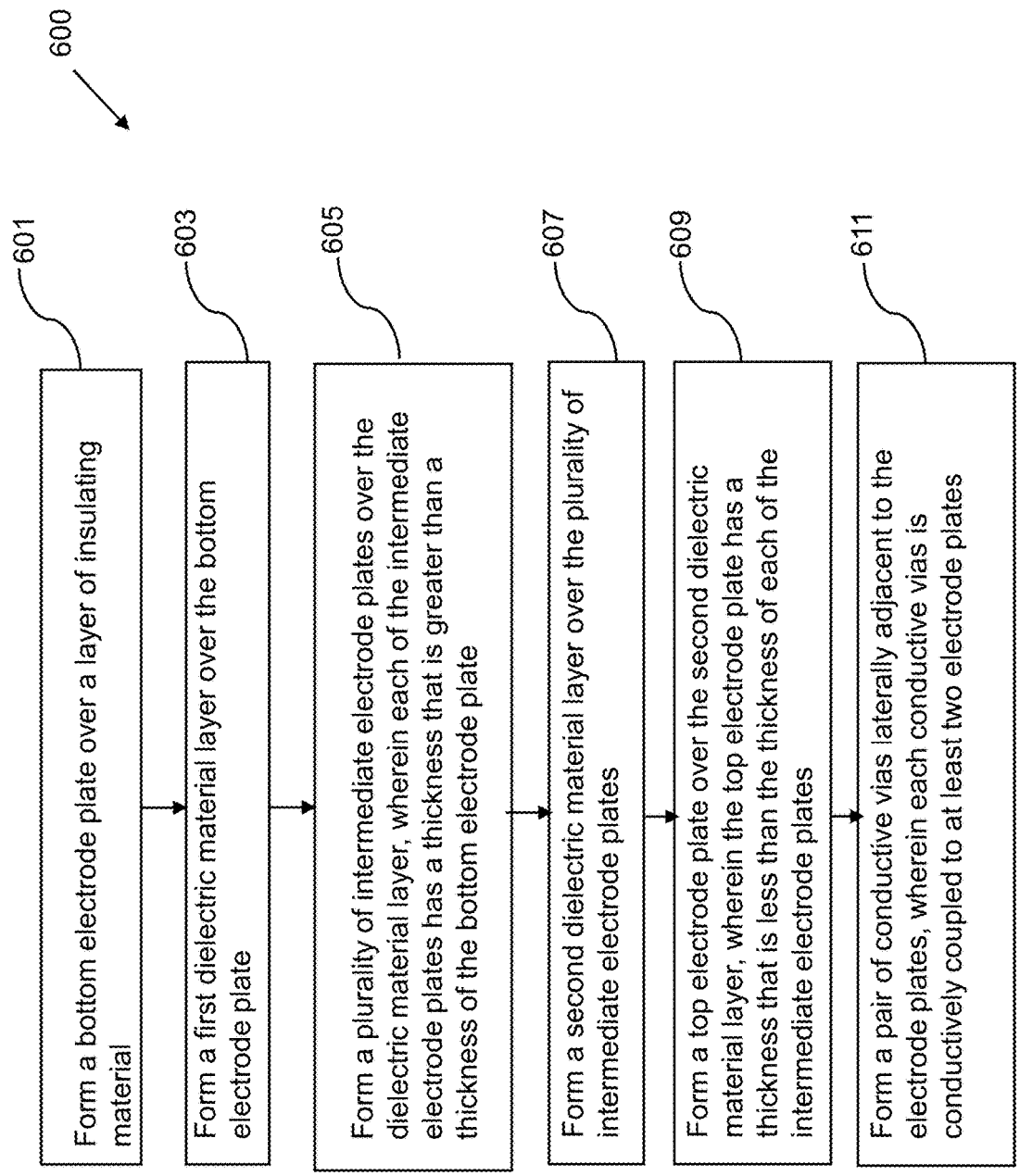
FIG. 18 is a flowchart that illustrates the general processing steps of the methods of the present disclosure.

FIG. 18 illustrates a general method 600 of making an IC device 100 including a MIM capacitor structure 105 according to various embodiments of the present disclosure. Referring to FIGS. 17A, 17B and 18, in step 601 of method 600, a bottom electrode plate 125a may be formed over a layer of insulating material 119a. Referring to FIGS. 17C and 18, in step 603 of method 600, a first dielectric material layer 503 may be formed over the bottom electrode plate 125a. Referring to FIGS. 17C-17L and 18, in step 605 of method 600, a plurality of intermediate electrode plates 127a, 127b and 127c may be formed over the dielectric material layer 503, where each of the intermediate electrode plates 127a, 127b and 127c has a thickness that is greater than a thickness of the bottom electrode plate 125a. Referring to FIGS. 17M and 18, in step 607 of method 600, a dielectric material layer 514 may be formed over the plurality of intermediate electrode plates 127a, 127b and 127c. Referring to FIGS. 17M, 17N and 18, in step 609 of method 600, a top electrode plate 125b may be formed over the dielectric material layer 514, where the top electrode plate 125b has a thickness that is less than the thickness of each of the intermediate electrode plates 127a, 127b and 127c. Referring to FIGS. 17O, 17P and 17Q, in step 611 of method 600, a pair of conductive vias 101, 103 may be formed laterally adjacent to the electrode plates 125a, 127a, 127b, 127c and 125b, where each of the conductive vias 101 and 103 may be conductively coupled to at least two electrode plates 125a, 127a, 127b, 127c and 125b.

Referring to all drawings and according to various embodiments of the present disclosure, an integrated circuit (IC) device 100 having a metal-insulator-metal (MIM) capacitor 105 includes a top electrode plate 125b, a bottom electrode plate 125a, a plurality of intermediate electrode plates 127a, 127b, 127c stacked between the top and bottom electrode plates 125a, 125b, and a plurality of dielectric layers 129 separating each of the top electrode plate 125b, the bottom electrode plate 125a and the intermediate electrode plates 127a, 127b, 127c from adjacent electrode plates of the MIM capacitor 105, where each of the intermediate electrode plates 127a, 127b, 127c has a thickness that is greater than a thickness of the top electrode plate 125a and the bottom electrode plate 125b.

In an embodiment, the IC device 100 further includes a first conductive via 101, and a second conductive via 103, where the MIM capacitor 105 is located between the first conductive via 101 and the second conductive via 103.

In another embodiment, the first conductive via 101 and the second conductive via 103 are connected to different voltages.

In another embodiment, the first conductive via 101 is connected to a supply voltage and the second conductive via is connected to a ground voltage.

In another embodiment, a total number of intermediate electrode plates 127 of the MIM capacitor 105 is odd, the top electrode plate 125b and the bottom electrode plate 125a are conductively coupled to the first conductive via 101, and a number of intermediate electrode plates 127 that are conductively coupled to the second conductive via 103 is greater than a number of intermediate electrode plates 127 that are conductively coupled to the first conductive via 101.

In another embodiment, a total number of intermediate electrode plates 127 of the MIM capacitor 105 is even, the top electrode plate 125b is conductively coupled to the first conductive via 101, the bottom electrode plate 125a is conductively coupled to the second conductive via 103, and a number of intermediate electrode plates 127 that are conductively coupled to the first conductive via 101 is equal to a number of intermediate electrode plates 127 that are conductively coupled to the second conductive via 103.

In another embodiment, the first and second conductive vias 101, 103 have the same opening size, and the opening size of the first and second conductive vias is between 1 μm and 10 μm.

In another embodiment, the MIM capacitor 105 includes a first MIM capacitor 105a, the IC device 100 further including a third conductive via 101, and a second MIM capacitor 105b located between the second conductive via 103 and the third conductive via 101, where the second MIM capacitor 105b includes a top electrode plate 125b, a bottom electrode plate 125a, a plurality of intermediate electrode plates 127 stacked between the top and bottom electrode plates 125a, 125b, and a plurality of dielectric layers 129 separating each of the top electrode plate 125b, the bottom electrode plate 125a and the intermediate electrode plates 127 from adjacent electrode plates of the second MIM capacitor 105b, and where each of the intermediate electrode plates 127 has a thickness that is greater than a thickness of the top electrode plate 125b and the bottom electrode plate 125a.

In another embodiment, the second MIM capacitor 105b has an identical structure as the first MIM capacitor 105a.

In another embodiment, the second MIM capacitor 105b has a symmetric structure with respect to the first MIM capacitor 105a.

In another embodiment, a via-to-via distance between the first conductive via 101 and the second conductive via 103 is different than a via-to-via distance between the second conductive via 103 and the third conductive via 101.

In another embodiment, a thickness of each of the intermediate electrode plates 127 of the MIM capacitor 105 is between 50 nm and 100 nm, and a thickness of the top electrode plate 125b and the bottom electrode plate 125a is between 10 nm and 45 nm.

In another embodiment, the MIM capacitor 105 includes a central region 130 in which the top electrode plate 125b, the plurality of intermediate electrode plates 127, and the bottom electrode plate 125a overlap in a vertical direction, and where each of the intermediate electrode plates 127 includes a first horizontally-extending segment 131 that contacts one of the first conductive via 101 and the second conductive via 103, a second horizontally-extending segment 133 that extends into the central region 130 of the MIM capacitor 105, and a vertically-extending segment 132 that extends between the first horizontally-extending segment 131 and the second horizontally-extending segment 133.

An additional embodiment is drawn to a method for fabricating a metal-insulator-metal (MIM) capacitor 105 between first and second conductive vias 101, 103 on an integrated circuit (IC) device 100, the method including determining whether a package resonant frequency of the IC device 100 is greater than a threshold frequency, determining a capacitance of the MIM capacitor 105 based on a default plate count of the electrode plates of the MIM capacitor 105 and a default distance between the first and second conductive vias 101, 103, increasing a plate count of the electrode plates 125, 127 of the MIM capacitor 105 when the package resonant frequency of the IC device 100 is not greater than the threshold frequency and the capacitance of the MIM capacitor 105 does not meet a predetermined performance criteria, and decreasing a distance between the first conductive via 101 and second conductive via 103 when the package resonant frequency of the IC device 100 is greater than the first frequency and the capacitance of the MIM capacitor 105 does not meet the design requirement of the MIM capacitor 105.

In one embodiment, the threshold frequency is between 50 MHz and 100 MHz.

In another embodiment, the method further includes increasing a plate count of the MIM capacitor 105 when the decreased distance between the first conductive via 101 and second conductive via 103 is less than a predetermined threshold distance between the first conductive via 101 and second conductive via 103 and the capacitance of the MIM capacitor 105 does not meet a predetermined performance criteria.

In another embodiment, the threshold distance between the first conductive via 101 and second conductive via 103 is between 3 μm and 9 μm.

An additional embodiment is drawn to a method of fabricating an integrated circuit (IC) device 100 including a metal-insulator-capacitor (MIM) 105, the method including forming a bottom electrode plate 125a over a layer of insulating material 119a, forming a first dielectric layer 503 over the bottom electrode plate 125a, forming a plurality of intermediate electrode plates 127a, 127b, 127c over the first dielectric material layer 503, where each of the intermediate electrode plates 127a, 127b, 127c has a thickness that is greater than a thickness of the bottom electrode plate 125a, forming a second dielectric material layer 514 over the plurality of intermediate electrode plates 127a, 127b, 127c, forming a top electrode plate 125b over the second dielectric material layer 514, where the top electrode plate 125b has a thickness that is less than a thickness of each of the intermediate electrode plates 127a, 127b, 127c, and forming a pair of conductive vias 101, 103 laterally adjacent to the electrode plates of the MIM capacitor, where each of the conductive vias is conductively coupled to at least two electrode plates 125, 127 of the MIM capacitor 105.

In an embodiment, each of the conductive vias 101, 103 contacts a metal feature 109, 110 of an underlying first metal level $M_1$ of an interconnect structure of the IC device 100, the method further including forming a second metal level $M_2$ of the interconnect structure over the MIM capacitor 105, where each of the conductive vias 101, 103 extends between metal features 107, 108, 109, 110 of the first and second metal levels $M_1$, $M_2$ of the interconnect structure.

In another embodiment, the second metal level $M_2$ is a redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor comprising:
a top electrode plate;
a bottom electrode plate;
a plurality of intermediate electrode plates stacked between the top and bottom electrode plates; and
a plurality of dielectric layers separating each of the top electrode plate, the bottom electrode plate and each of the plurality of intermediate electrode plates from adjacent electrode plates of the MIM capacitor,
wherein each of the plurality of intermediate electrode plates has a thickness that is greater than a thickness of the top electrode plate.

2. The MIM capacitor of claim 1, further comprising:
a first conductive via; and
a second conductive via, wherein the top electrode plate, the bottom electrode plate, and the plurality of intermediate electrode plates are located between the first conductive via and the second conductive via.

3. The MIM capacitor of claim 2, wherein the first conductive via and the second conductive via are connected to different voltages.

4. The MIM capacitor of claim 3, wherein the first conductive via is connected to a supply voltage and the second conductive via is connected to a ground voltage.

5. The MIM capacitor of claim 2, wherein a total number of intermediate electrode plates of the MIM capacitor is odd, the top electrode plate and the bottom electrode plate are conductively coupled to the first conductive via, and a number of intermediate electrode plates that are conductively coupled to the second conductive via is greater than a number of intermediate electrode plates that are conductively coupled to the first conductive via.

6. The MIM capacitor of claim 2, wherein a total number of intermediate electrode plates of the MIM capacitor is even, the top electrode plate is conductively coupled to the first conductive via, the bottom electrode plate is conductively coupled to the second conductive via, and a number of intermediate electrode plates that are conductively coupled to the first conductive via is equal to a number of intermediate electrode plates that are conductively coupled to the second via.

7. The MIM capacitor of claim 2, wherein the first conductive via and second conductive via have the same opening size, and the opening size of the first conductive via and second conductive via is between 1 μm and 10 μm.

8. The MIM capacitor of claim 1, wherein a thickness of the bottom electrode plate is the same as the thickness of the top electrode plate.

9. The MIM capacitor of claim 1, wherein a thickness of each of the plurality of intermediate electrode plates of the MIM capacitor is between 50 nm and 100 nm, and a thickness of the top electrode plate and the bottom electrode plate is between 10 nm and 45 nm.

10. The MIM capacitor of claim 1, wherein the MIM capacitor comprises a central region in which the top electrode plate, the plurality of intermediate electrode plates, and the bottom electrode plate overlap in a vertical direction, and wherein each of the plurality of intermediate electrode plates comprises a first horizontally-extending segment that contacts one of the first conductive via and the second conductive via, a second horizontally-extending segment that extends into the central region of the MIM capacitor, and a vertically-extending segment that extends between the first horizontally-extending segment and the second horizontally-extending segment.

11. A metal-insulator-metal (MIM) capacitor, comprising:
a top electrode plate;
a bottom electrode plate;
an intermediate electrode plate located between the top electrode plate and the bottom electrode plate; and
a first dielectric layer located between the intermediate electrode plate and the top electrode plate;
a second dielectric layer located between the intermediate electrode plate and the bottom electrode plate;
wherein the intermediate electrode plate has a thickness that is greater than a thickness of the top electrode plate and a thickness of the bottom electrode plate.

12. The MIM capacitor of claim 11, wherein a thickness of the intermediate electrode plate is between 50 nm and 100 nm, and a thickness of the top electrode plate and the bottom electrode plate is between 10 nm and 45 nm.

13. The MIM capacitor of claim 12, wherein a thickness of the first dielectric layer and a thickness of the second dielectric layer are less than the thicknesses of the intermediate electrode plate, the top electrode plate, and the bottom electrode plate.

14. The MIM capacitor of claim 13, wherein first dielectric layer and the second dielectric layer comprise at least one of hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide ($ZrO_2$), titanium oxide ($TiO_2$), alumina ($Al_2O_3$), hafnium dioxide-alumina ($HfO_2$—$Al_2O_3$), tantalum oxide ($Ta_2O_5$), $SiO_x$/$SiN_y$/$SiO_x$ and a ferroelectric material.

15. The MIM capacitor of claim 11, further comprising:
a first conductive via; and
a second conductive via, wherein the top electrode plate, the bottom electrode plate, and the intermediate electrode plate are located between the first conductive via and the second conductive via.

16. The MIM capacitor of claim 15, wherein the first conductive via is connected to a supply voltage and the second conductive via is connected to a ground voltage.

17. A method of fabricating a metal-insulator-capacitor (MIM), comprising:
forming a bottom electrode plate;
forming a first dielectric layer over the bottom electrode plate;
forming at least one intermediate electrode plate over the first dielectric material layer;
forming a second dielectric material layer over the at least one intermediate electrode plate;
forming a top electrode plate over the second dielectric material layer, wherein the top electrode plate has a thickness that is less than a thickness of each intermediate electrode plate; and
forming a pair of conductive vias laterally adjacent to the electrode plates of the MIM capacitor, wherein each of the pair of conductive vias is conductively coupled to at least one electrode plate of the MIM capacitor.

18. The method of claim 17, wherein forming at least one intermediate electrode plate over the first dielectric material layer comprises forming a plurality of intermediate electrode plates over the first dielectric material layer, wherein an additional dielectric material layer is formed between adjacent intermediate electrode plates of the plurality of intermediate electrode plates, and each of the pair of conductive vias is conductively coupled to at least two electrode plates of the MIM capacitor.

19. The method of claim 17, wherein each of the pair of conductive vias contacts a metal feature of an underlying first metal level of an interconnect structure of an IC device, the method further comprising:
forming a second metal level of the interconnect structure above the top electrode plate, wherein each of the pair of conductive vias extends between metal features of the underlying first metal level and the second metal level of the interconnect structure.

20. The method of claim 19, wherein the second metal level comprises a redistribution layer.

* * * * *